United States Patent
Johnson et al.

(10) Patent No.: US 6,534,374 B2
(45) Date of Patent: Mar. 18, 2003

(54) SINGLE DAMASCENE METHOD FOR RF IC PASSIVE COMPONENT INTEGRATION IN COPPER INTERCONNECT PROCESS

(75) Inventors: Eric Johnson, Singapore (SG); Chester Leung, Singapore (SG); Bo Yu, Singapore (SG); Yin Qian, Singapore (SG); Mark Hatzilambrou, Singapore (SG); My The Doan, Singapore (SG)

(73) Assignee: Institute of Microelectronics, Singapore (SG)

( * ) Notice: Subject to any disclaimer, the term of this patent is extended or adjusted under 35 U.S.C. 154(b) by 132 days.

(21) Appl. No.: 09/876,627

(22) Filed: Jun. 7, 2001

(65) Prior Publication Data

US 2002/0197844 A1 Dec. 26, 2002

(51) Int. Cl.$^7$ .............................................. H01L 21/20
(52) U.S. Cl. .................... 438/381; 438/329; 438/384; 438/393; 438/396
(58) Field of Search ................................ 438/618, 309, 438/329, 330, 381, 382, 384, 393, 396, 397

(56) References Cited

U.S. PATENT DOCUMENTS

| | | | |
|---|---|---|---|
| 4,418,470 A | * 12/1983 | Naster et al. ................ 438/149 |
| 5,162,258 A | * 11/1992 | Lemnios et al. .............. 438/10 |
| 5,268,315 A | 12/1993 | Prasad et al. .................. 437/31 |
| 5,370,766 A | 12/1994 | Desaigoudar et al. ....... 156/643 |
| 5,446,311 A | 8/1995 | Ewen et al. ................. 257/531 |
| 5,652,173 A | 7/1997 | Kim ........................... 437/60 |
| 5,926,359 A | 7/1999 | Greco et al. ................ 361/311 |
| 5,946,567 A | 8/1999 | Weng et al. ................ 438/250 |
| 6,040,226 A | 3/2000 | Wojnarowski et al. ...... 438/381 |
| 6,083,785 A | 7/2000 | Segawa et al. ............. 438/238 |
| 6,117,747 A | 9/2000 | Shao et al. ................. 438/396 |
| 6,259,128 B1 | * 7/2001 | Adler et al. ................ 257/301 |
| 6,313,003 B1 | * 11/2001 | Chen .......................... 438/396 |

OTHER PUBLICATIONS

'System on a Chip' Technology Platform for 0.18 um Digital, Mixed Signal & eDRAM Application; R. Mahnkopf et al.; four pages; presented at 1999 IEDM, copyright 1999.
"Integration of Thin Film MIM Capacitors and Resistors into Copper Metallization based RF–CMOS and Bi–CMOS Technologies;" Peter Zurcher et al.; IEDM; pp. 00–153 to 00–156 (7.3.1 to 7.3.4); Copyright 2000.
"Spiral Inductors and Transmission Lines in Silicon Technology Using Copper–Damascene Interconnects and Low–Loss Substrates;" Joachim N. Burghartz et al.; pp. 1961 to 1968; Copyright 1997.

(List continued on next page.)

Primary Examiner—Amir Zarabian
Assistant Examiner—Khanh Duong
(74) Attorney, Agent, or Firm—George O. Saile; Stephen B. Ackerman; Stephen G. Stanton

(57) ABSTRACT

A method of integrated circuit component integration in copper interconnects, including the following steps of the first embodiment. A wafer is provided having an exposed top-most planar copper interconnect. The wafer being divided into one or more areas selected from the group consisting of: a spiral inductor area having an exposed planar copper interconnect bottom half of a stacked spiral inductor; a MIM capacitor area having an exposed planar copper interconnect bottom plate and an exposed planar copper interconnect contact point of a MIM capacitor; and a precision resistor area having a two exposed planar copper interconnect routing points of a precision resistor. A spiral inductor is formed within the spiral inductor area; a MIM capacitor is formed within the MIM capacitor area; and a precision resistor is formed within the precision resistor area.

31 Claims, 14 Drawing Sheets

OTHER PUBLICATIONS

"Interconnect Passive Components for Mixed Signal /RF Applications;" Arjun Kar–Roy et al.; pp. 80 to 89; IEEE Trans on Microwave Theory and Techniques; vol. 45, No. 10, Oct. 1997.

"Single Mask Metal–Insulator–Metal (MIM) Capacitor with Copper Damascene Metallization for Sub–0.1 8um Mixed Mode Signal and System–on–a–Chip (SoC) Applications;" Ruichen Liu et al; presented at year 2000 IITC held Jun. 4 to 7, 2000.

* cited by examiner

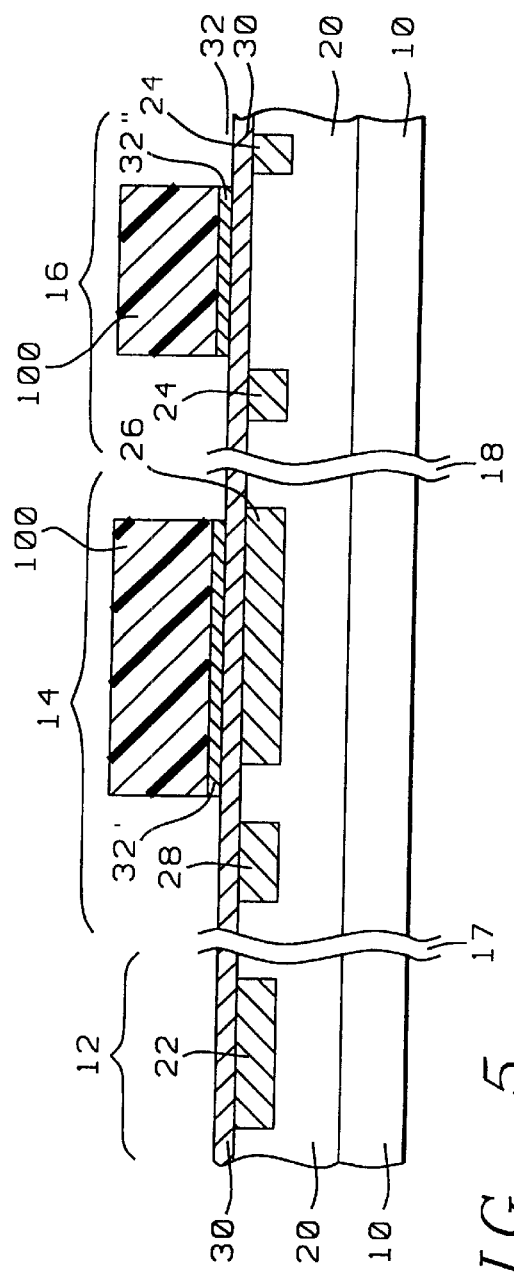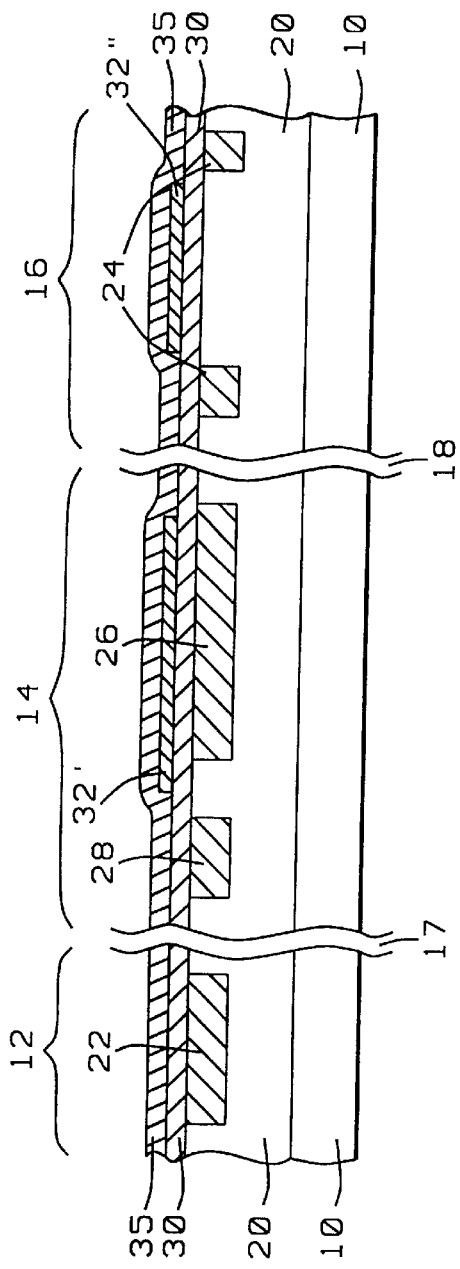

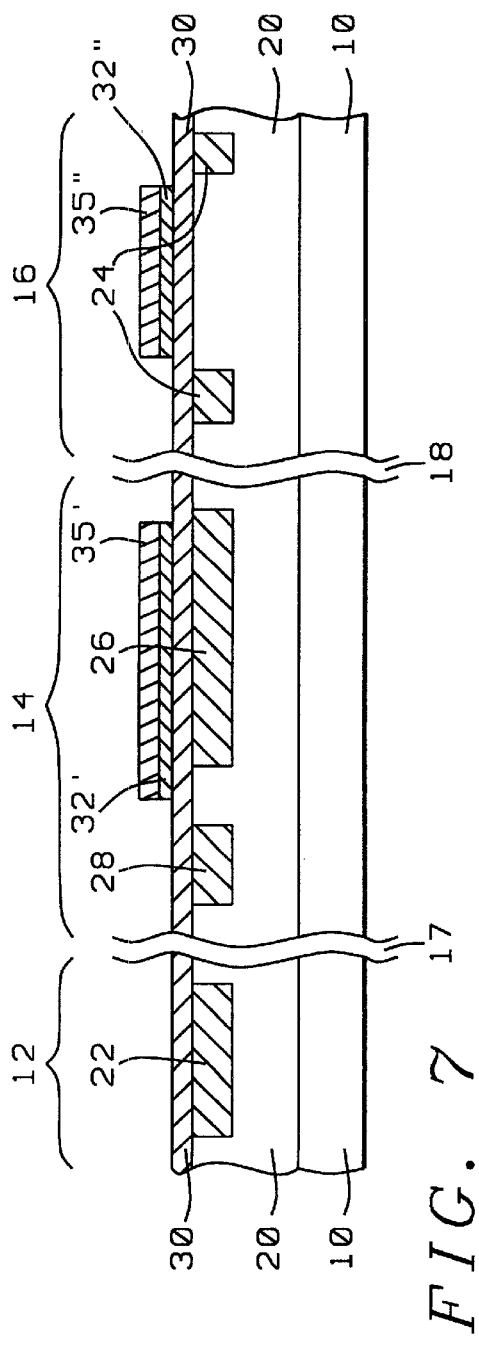
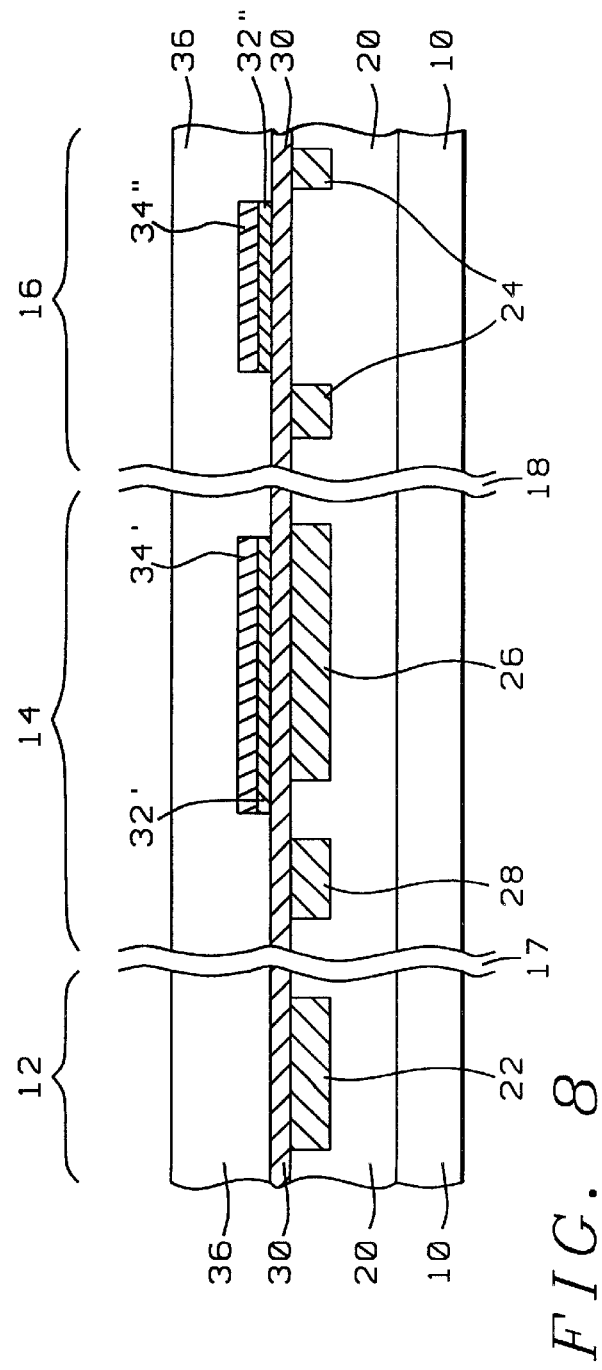

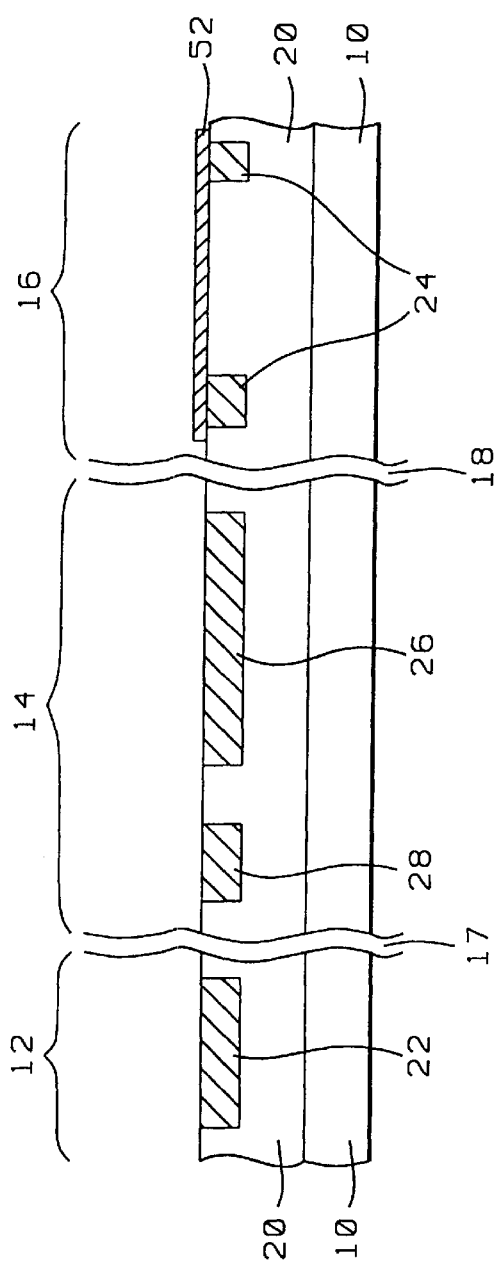
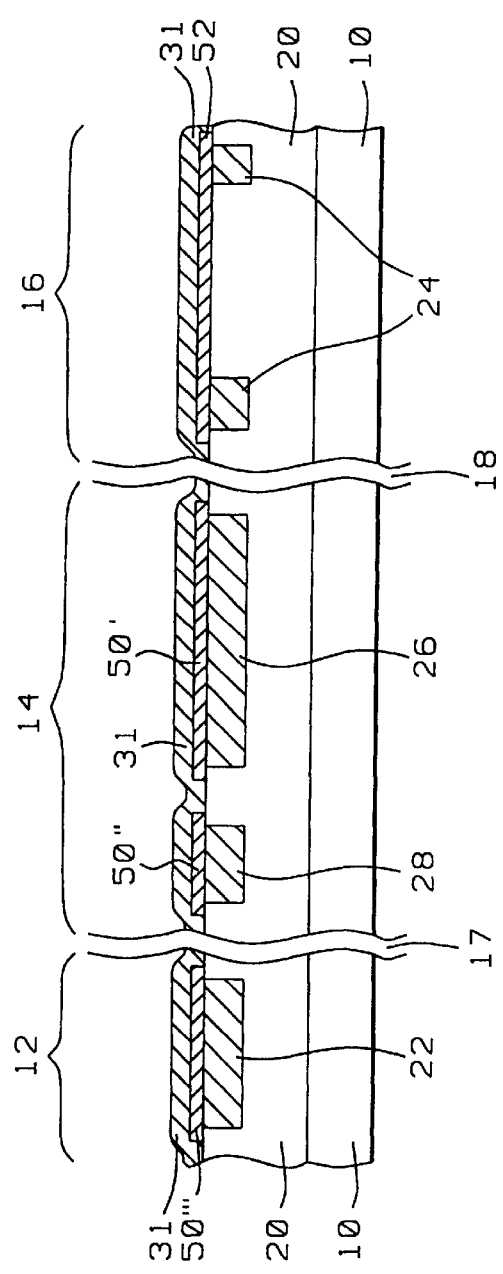
FIG. 12
FIG. 13

SINGLE DAMASCENE METHOD FOR RF IC PASSIVE COMPONENT INTEGRATION IN COPPER INTERCONNECT PROCESS

FIELD OF THE INVENTION

The present invention relates generally to semiconductor fabrication and more specifically to a method of integrating copper inductor, MIM capacitor and precision resistors in a copper IC.

BACKGROUND OF THE INVENTION

Inductors with aluminum (Al) or copper (Cu) have been employed in integrated circuit (IC) technology, often with a stack of multiple metal films connected by vias to reduce the metal resistance. The metal-insulator-metal (MIM) is typically built with an intermediate metal (Al, titanium nitride (TiN), etc.) between interconnect metal layers and vias (tungsten (W)-plug or hot-Al flow) to contact the top MIM electrode. In the case of precision resistors, the high resistance metal is usually deposited specifically for its sole use as a resistor.

U.S. Pat. No. 5,926,359 to Greco et al. describes an interconnection wiring system incorporating two levels of interconnection wiring separated by a first dielectric, a capacitor formed by a second dielectric, a bottom electrode or the lower interconnection wiring or a via and a top electrode of the upper interconnection wiring or a separate metal layer.

U.S. Pat. No. 5,652,173 to Kim et al. describes a monolithic microwave integrated circuit (MMIC) is produced by a method which forms multilevel conductive members, including thick low-loss metallic members.

U.S. Pat. No. 6,083,785 to Segawa et al. describes a method of manufacturing a semiconductor device having resistor film. An isolation is formed in a part of a P-well of a semiconductor substrate. A resistor film is formed on the isolation as a first conductor member. An insulating film covering the resistor film, except for contact formation regions, and an upper electrode film, as a second conductor member, are simultaneously formed with the formation of a gate electrode and a gate oxide film.

U.S. Pat. No. 5,268,315 to Prasad et al. describes an HBT IC process that can fabricate npn heterojunction bipolar transistors, Schottky diodes, MIM capacitors, spiral inductors and NiCr resistors.

U.S. Pat. No. 6,040,226 to Wojnarowski et al. describes a method for the manufacture of precision electronic components such as resistors, inductors and capacitors on a polymer or ceramic surface. The electronic components can be deposited and trimmed to precise or matched values without having precise depositions of all of the pre-patterned materials.

U.S. Pat. No. 5,370,766 to Desaigoudar et al. describes methods for fabrication of thin film inductors, inductor networks and integration with other passive and active devices.

U.S. Pat. No. 5,946,567 to Weng et al. describes a method for making metal capacitors for deep submicrometer processes for integrated circuits.

U.S. Pat. No. 6,117,747 to Shao et al. describes a method for fabricating a metal-oxide-metal capacitor using a dual damascene process.

U.S. Pat. No. 5,446,311 to Ewen et al. describes a monolithic high-Q inductor structure formed with multiple metallization levels in a conventional integrated circuit technology in which inductor turns utilize multiple levels to reduce the inductor resistance.

The article entitled "Integration of Thin Film MIM Capacitors and Resistors into Copper Metallization based RF-CMOS and Bi-CMOS Technologies;" Peter Zurcher et al.; IEDM; pp. 00-153 to 00-156 (7.3.1 to 7.3.4); copyright 2000; describes high precision metal-insulator-metal (MIM) capacitors with a capacitance density of 1.6 $fF/\mu m^2$ and metal thin film resistors of 50 ohm/sq. sheet resistance and a negative temperature coefficient of resistivity smaller than 100 ppm/° C. that have been integrated in a dual-inlaid Cu-based backend for mixed-signal applications.

The article entitled "'System on a Chip'Technology Platform for 0.18 $\mu m$ Digital, Mixed Signal & eDRAM Application;" R. Mahnkopf et al.; four (4) pages; presented at 1999 IEDM; copyright 1999; describes a 0.18 $\mu m$ high performance/low power technology platform which allows 'systems on a chip integration' for a broad spectrum of products.

The article entitled "Spiral Inductors and Transmission Lines in Silicon Technology Using Copper-Damascene Interconnects and Low-Loss Substrates;" Joachim N. Burghartz et al.; pp. 1961 to 1968; copyright 1997; describes fabrication of spiral inductors and different types of transmission lines using copper damascene interconnects and high-resistivity silicon (HRS) or sapphire substrates.

The article entitled "Interconnect Passive Components for Mixed Signal/RF Applications;" Ariun Kar-Roy et al.; pp. 80 to 89; IEEE Trans on Microwave Theory and Techniques; Vol. 45 No. 10; October, 1997; describes performance issues of interconnect passive components and their integration into subtractive Al processes and dual damascene copper processes. Migration of capacitors towards high-k dielectrics such as Ta2O5, characterization of free lateral MIM capacitors and results of integration of photo-BCB as a thick dielectric to improve upon inductor Q are also presented.

The article entitled "Single Mask Metal-Insulator-Metal (MIM) Capacitor with Copper Damascene Metallization for Sub-0.18 $\mu m$ Mixed Mode Signal and System-on-a-Chip (SoC) Applications;" Ruichen Liu et al.; presented at year 2000 IITC held Jun. 4 to 7, 2000; describes fabrication of low leakage, high linearity MIM capacitors directly on Cu by using a PECVD SiN as both the capacitor dielectric and the diffusion barrier for Cu.

SUMMARY OF THE INVENTION

Accordingly, it is an object of the present invention to provide a cost effective method of integrating copper inductor, MIM capacitor and precision resistors in a copper IC fabrication process.

Another object of the present invention is to provide a method of integrating copper inductor, MIM capacitor and precision resistors in a copper IC fabrication process using conventional equipment and materials.

A further object of the present invention is to provide a method of integrating copper inductor, MIM capacitor and precision resistors in a copper IC fabrication process with minimal extra masking or processing.

Yet another object of the present invention is to produce high performance components (high inductor Q (quality)-factor; high capacitance capacitors; and low temperature coefficient (Tcr) resistors).

Another object of the present invention is to fabricate high performance integrated circuit (IC) passive components (inductor, MIM capacitor, and precision resistor) compatible with copper interconnects and using conventional equipment and materials using a minimum of two masking steps.

Other objects will appear hereinafter.

It has now been discovered that the above and other objects of the present invention may be accomplished in the following manner. Specifically, in the first embodiment, wafer is provided having an exposed top-most planar copper interconnect. The wafer being divided into one or more areas selected from the group consisting of: a spiral inductor area having an exposed planar copper interconnect bottom half of a stacked spiral inductor; a MIM capacitor area having an exposed planar copper interconnect bottom plate and an exposed planar copper interconnect contact point of a MIM capacitor; and a precision resistor area having a two exposed planar copper interconnect routing points of a precision resistor. A first insulator layer is formed over the structure. A metal layer is formed over the first insulator layer. A first patterned masking layer is formed over the metal layer covering at least a portion of the MIM capacitor area exposed planar copper interconnect bottom plate and at least a portion of the area between the precision resistor area planar copper interconnect routing points. The metal layer over the first dielectric insulator layer is etched, without substantially etching the underlying first dielectric insulator layer, using the patterned first masking layer as a mask, to form a metal top plate over at least a portion of the interconnect bottom plate of a MIM capacitor and a patterned metal layer portion between the two planar copper interconnect routing points of a precision resistor. A second insulator layer is formed over the structure. A second patterned masking layer is formed over the second insulator layer exposing portions of the second insulator layer over: the planar copper interconnect bottom half of a stacked spiral inductor; at least a portion of the metal top plate and at least a portion of the planar copper interconnect contact point of a MIM capacitor; and the two exposed planar copper interconnect routing points of a precision resistor. The second insulator layer is etched using the second patterned masking layer as a mask to form: an inductor trench exposing the planar copper interconnect bottom half of a stacked spiral inductor; a MIM capacitor trench exposing at least a portion of the metal top plate and at least a portion of the planar copper interconnect contact point of a MIN capacitor; and routing point trenches exposing the two exposed planar copper interconnect routing points of a precision resistor. The inductor trench, MIM capacitor trench and the routing point trenches are filled with planarized metal to complete formation of the following devices as selected: the spiral inductor within the spiral inductor area; the MIM capacitor within the MIM capacitor area; and the precision resistor within the precision resistor area.

BRIEF DESCRIPTION OF THE DRAWINGS

The present invention will be more clearly understood from the following description taken in conjunction with the accompanying drawings in which like reference numerals designate similar or corresponding elements, regions and portions and in which:

FIGS. 3 to 10 illustrate a first embodiment of the present invention, with optional variations.

FIGS. 11 to 16 illustrate a second embodiment of the present invention, with optional variations.

DETAILED DESCRIPTION OF THE PREFERRED EMBODIMENT

Unless otherwise specified, all structures, layers, steps, methods, etc. may be formed or accomplished by conventional steps or methods known in the prior art.

The present invention describes a method for making radio frequency (RF) integrated circuit (IC) passive devices such as inductor, precision resistor and capacitor components, for example, compatible with copper interconnect metallization. The method or the present invention requires minimal modifications to conventional copper damascene interconnect processes and uses as few as two additional masking layers to create the inductor, resistor and capacitor, for example.

The described method occurs after standard digital wafer processing is completed and will not alter the digital device behavior and design rule. The components are built in the top-most interconnect layer, or above, thus any coupling capacitance with the semiconductor substrate is minimized which becomes especially important at RF frequencies. It can produce, for example, high quality (Q)-factor inductors with low resistance, precision resistors with low temperature coefficients and well-controlled metal-insulator-metal (MIM) capacitors.

Although the instant invention is described and illustrated in the accompanying figures as fabricating RF IC inductor, precision resistor and capacitor components, one skilled in the relevant art will appreciate applicability of the teachings of the instant invention to other specific uses.

It is also noted within the figures, the dimensions illustrated are exaggerated to assist in the identification of layers. Further, the figures are not intended to indicate the structure layouts in their entirety nor are the plan-view permutations of all possible structure layouts captured.

The method of the instant invention involves completing all necessary metal routing levels using copper dual damascene or single damascene IC wafer processes for at least the last, i.e. top-most, interconnect wiring level, Lower lying interconnect layers may be copper aluminum based, as desired.

Initial Structure

Figure 1:
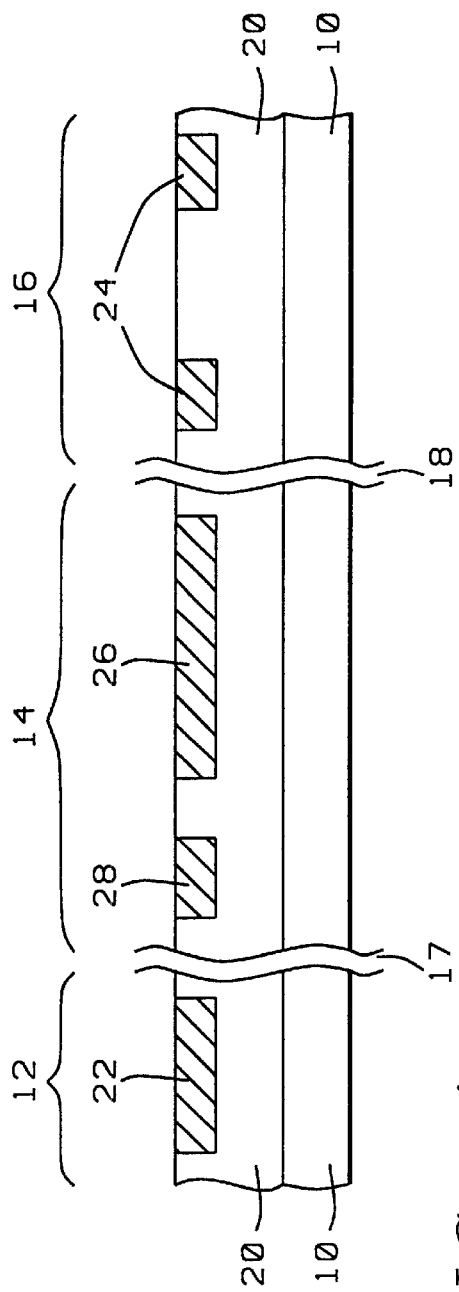
FIG. 1 illustrates an initial structure common to both embodiments of the present invention.
Figure 2:
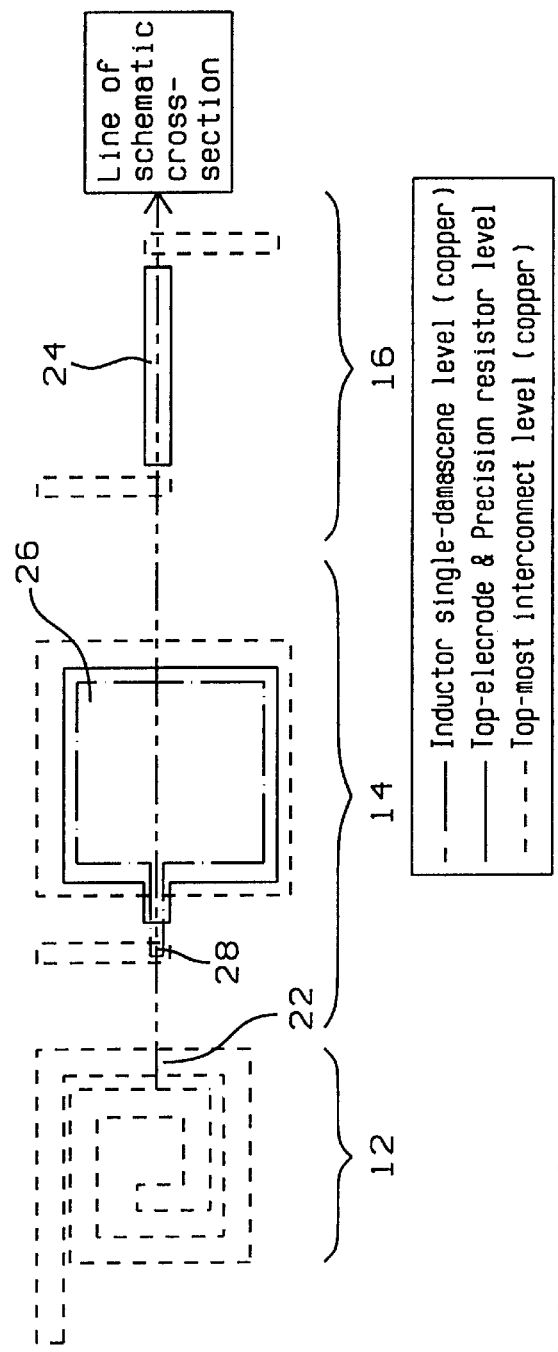
FIG. 2 is a plan view of FIG. 1 with FIG. 1 taken along line A—A of FIG. 2.

FIGS. 1 and 2 illustrate the starting structure for both the first and second embodiments of the present invention.

As shown in FIG. 1, IC wafer 10 may be divided into an inductor area 12, MIM capacitor area 14 and precision resistor area 16 that may be separated in distance upon wafer 10 as indicated by dashed lines 17, 18. Wafer 10 may be comprised of ordinary silicon IC wafers (bulk silicon (Si), epitaxial Si or silicon germanium (SiGe), or silicon-on-insulator) for digital or mixed-signal processes in CMOS, BiCMOS, bipolar or heterojunction technology.

IC wafer 10 is fabricated with the top-most metal (first metal layer) using a planar copper (damascene) interconnect. Silicon oxide or low-k (low dielectric constant) in insulator layer 20 may have structures defined therein, i.e., e.g., the bottom half 22 of stacked spiral inductor 12, the bottom plate or planar bottom electrode 26 of MIM capacitor 14, a routing point, or contact point, 28 to later receive connection with the MIM top-electrode metal, and two routing points, or contacts, 24 to later receive connection with the ends of a precision resistor 16. Each of these structures 22, 24, 26, 28 are preferably formed of copper, aluminum or alloys of aluminum, and are more preferably formed of copper.

FIG. 2 is a plan, or top down, view that includes the structure of FIG. 1. As shown in FIG. 2, spiral inductor 12 may have one to ten or more "turns" in a spiral shape. In the case of MIM capacitor 14, a relatively large, i.e. from about 50 to 200 micron per side, square or rectangular feature is defined to generate sufficient area for a desirable capacitance value. An optional layout using "slots" in the large capacitor or an array of smaller polygon features connected in parallel may also be considered if dual damascene patterning of a singer larger square creates intolerable copper thickness variations due to chemical mechanical polishing (CMP) dishing effects.

First Embodiment

FIGS. 3 to 10, in conjunction with FIGS. 1 and 2, illustrate the first embodiment of the present invention.

Formation of Diffusion Barrier and MIM Dielectric Layer 30 and Thin Metal Layer 32

Figure 3:
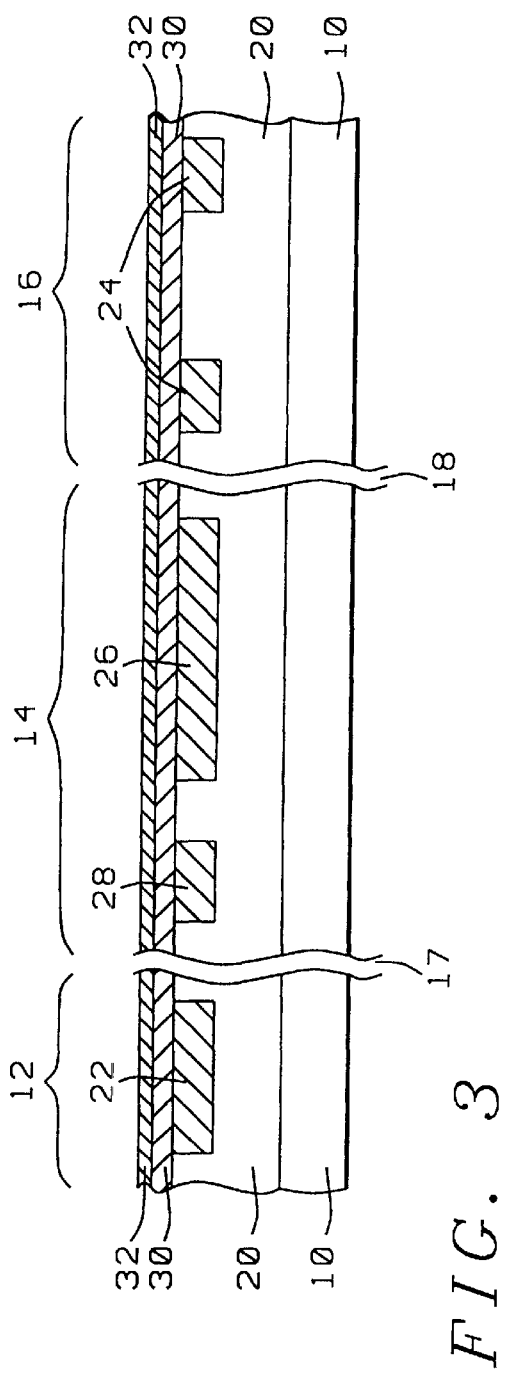

As shown in FIG. 3, a dielectric insulator material is deposited to form first dielectric insulator layer 30 and functions as both a metal (copper) diffusion barrier and the MIM capacitor 14 dielectric. First dielectric insulator layer 30 is preferably comprised of SiN, tantalum pentoxide ($Ta_2O_5$), SiON, $ZrO_2$, $HfO_2$, $Al_2O_3$, $Y_2O_3$, MgO, $TiO_2$, combinations thereof, ferroelectric materials, or other high dielectric materials and multi-layer oxide, and is more preferably comprised of SiN and has a thickness of preferably from about 200 to 1000 Å depending upon the material selection and design criteria. More preferably, dielectric insulator layer 30 is comprised of SiN and is from about 600 to 700 Å thick to satisfy both a typically targeted capacitance density (1 $10^{-15}$ Farad/square micron) and Cu diffusion barrier properties (so that greater than about 300 Å of SiN thickness remains outside the capacitor areas after losses resulting from a subsequent top-electrode patterning).

Immediately after formation of first dielectric insulator layer 30, a relatively thin, resistive metal layer (second metal layer) 32 is formed over first dielectric insulator layer 30 using conventional resist masking and wet chemical or plasma etching techniques. Metal layer 32 serves as the top-electrode of MIM capacitor 14 and may be simultaneously chosen with a sufficient thickness and resistivity to serve as the resistor.

Metal layer 32 is preferably formed by evaporation, chemical vapor deposition (CVD) or physical vapor deposition (PVD) sputtering to a thickness of preferably from about 200 to 700 Å and more preferably from about 200 to 1000 Å. Metal layer 32 is preferably comprised of TaN, Ta, TiN, TiW, NiCr, MoN, WN or WSiN and is more preferably comprised of Ta, TaN or TiN and is most preferably comprised of or Ta or TaN.

The relatively thin metal layer 32 creates only a modest step height for subsequent dielectric(s) layers to cover and reduces the need for over-polish for the later single damascene copper removal.

Metal layer 32 has an etch selectivity of at least about 2:1 to the underlying first insulator layer 30 which assures that at least some insulator 30 is retained after etching and cleaning to prevent exposure of copper and to maintain a desired copper diffusion barrier thickness.

A Ta or TaN metal layer 32 having a thickness of from about 200 to 700 Å is preferred to create a useful thin film sheet resistance for precision resistors 16. In the event precision resistors 16 are not required, metal layer/second metal layer 32 serves only as the top electrode of MIM capacitor 14 and is then preferably comprised of Al or Al alloy metals (due to aluminum's low resistance and low cost manufacturing) having a thickness of preferably from about 500 to 1500 Å and more preferably from about 700 to 1200 Å.

When using Al or an Al alloy for metal layer 32, an underlying thin metal film (not shown), preferably comprised of Ta, TaN, Ti, TiN or TiW and more preferably comprised of Ti or TiN, below Al/Al alloy metal layer 32 may optionally be used to best regulate the Al grain size and optimize the etch selectivity to the underlying SiN diffusion barrier layer 30.

Figure 4:
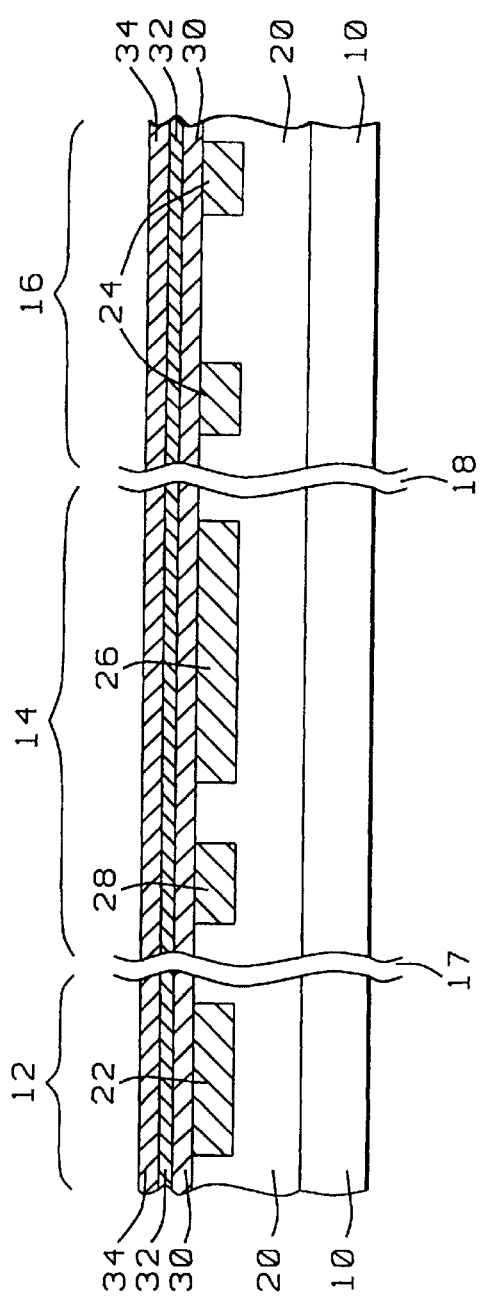

Optional Additional Thin Dielectric Capping Layer 34 Over Thin Metal Layer 32 Before Masking Optionally, as only shown in FIG. 4, thin metal layer 32 may be capped with an additional thin dielectric capping layer 34 (before the top-plate (resistor) metal 32 is masked and etched) which assists in the patterning and protection of metal layer 32 from later processing (such as resist stripping or later etching of layer 36) which may alter resistance values. Optional thin dielectric capping layer 34 is preferably comprised of SiN, $SiO_2$ or SiON and is more preferably comprised of SiN, and has a thickness of preferably from about 200 to 1000 Å and more preferably from about 500 to 700 Å.

Figure 7:
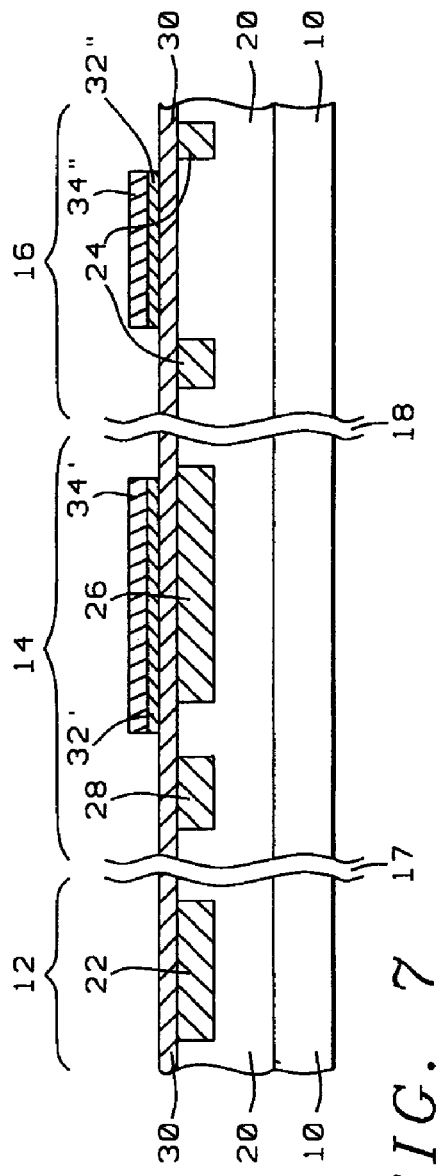

FIG. 7 illustrates the appearance of the wafer using layer 34 to assist in patterning of the resistor/top-electrode metal layer 32 to also form additional dielectric layer portion 34' over top electrode patterned metal layer portion (metal top plate) 32' of MIM capacitor 14; and additional dielectric layer portion 34" over patterned metal layer portion 32" of precision resistor 16.

Patterning of Thin Metal Layer 32

As shown in FIG. 5, the thin metal layer 32 of FIG. 3 is patterned using conventional resist lithography, or other masking layers, and etching techniques (or patterning techniques with or without masking layers) while preserving underlying first dielectric insulator layer 30 to maintain its Cu diffusion barrier function. A resist lithography patterned first masking layer 100 aligned to the top-most interconnect level is used to define and preserve at least the MIM capacitor's 14 top electrode second patterned metal layer 32'.

The use of, preferably a wet chemical or more preferably a plasma etch process, to remove second thin metal layer 32 in areas not protected by the first resist masking layer results in the structure shown in FIG. 5 with patterned metal layer portion (metal top plate) 32' as the top electrode of MIM capacitor 14 and patterned metal layer portion 32" of precision resistor 16.

Optional Additional Dielectric Layer 35 After Masking

As shown in FIG. 6, an optional additional dielectric layer 35 may be formed over the structure (after the top-plate (resistor) metal 32 is masked and etched) and over the etched thin metal layer portions 32', 32''. Optional additional dielectric layer 35 is preferably comprised of $SiC_xH_y$ or SiN and has a thickness of preferably from about 200 to 1000 Å and more preferably from about 300 to 500 Å.

Optional additional dielectric layer 35 can serve to cap the top electrode second metal portion 32' of MIM capacitor 14 for subsequent damascene etch optimization. Optional additional dielectric layer 35 may also be beneficial to selectively stop etching if it is later desired to remove part(s) of patterned metal layer portion 32'' of insulator dielectric over the resistor area 16 in applications requiring laser trimming.

Figure 8:
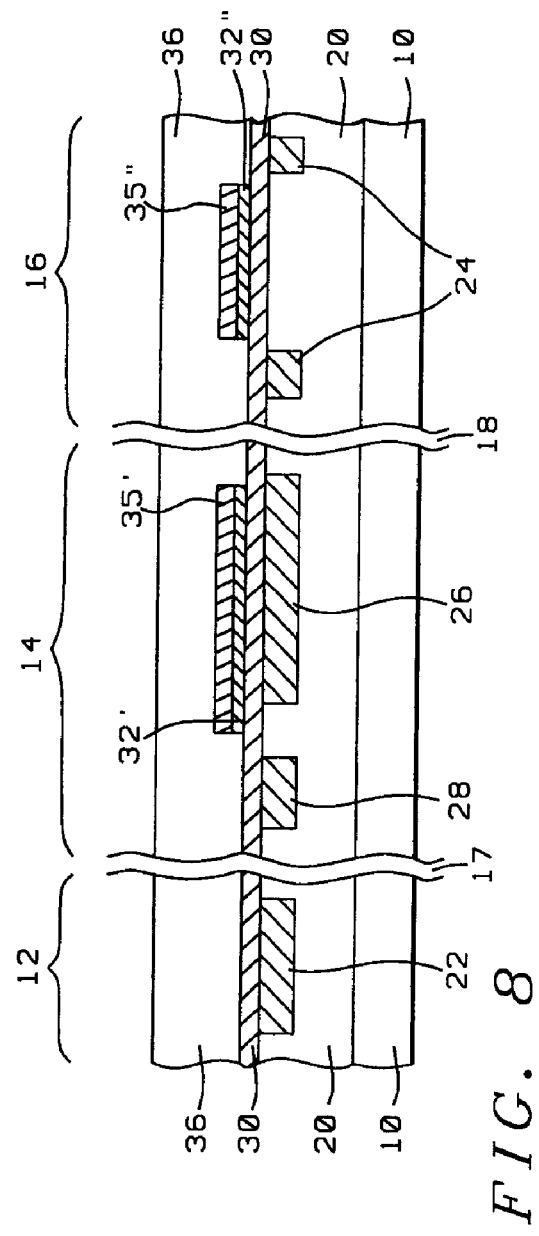

As shown in FIG. 8, optional additional dielectric layer 35 may then be patterned to form: additional dielectric layer portion 35' over top electrode patterned metal layer portion 32' of MIM capacitor 14; and additional dielectric layer portion 35'' over patterned metal layer portion 32'' of precision resistor 16.

Formation of Second Insulator Layer 36

As further shown in FIG. 8, and regardless of whether optional dielectric layer 34 is formed before the top-plate (resistor) metal 32 is masked and etched (FIGS. 4 and 7) or whether optional dielectric layer 35 is formed after the top-plate (resistor) metal 32 is masked and etched (FIGS. 5, 6 and 8), a relatively thick second insulator layer 36 is then formed over the structure a thickness of preferably from about 0.5 to 5.0 microns and more preferably from about 2.0 to 3.0 microns. The thickness of second insulator layer 36 will determine the final inductor copper 40 thickness and impact the inductor's 12 characteristic behavior. The second insulator layer 36 thickness may be optimized according to the device's intended operating frequency. It is noted that only dielectric layer portions 35', 35'' are shown in FIG. 8 although dielectric layer portions 35', 35'' could be replaced with portions 34', 34'' if the option illustrated in FIGS. 4 and 7 are used.

Second insulator layer 36 is preferably formed by plasma enhanced CVD (PECVD) or spin-on techniques and is preferably comprised of: silicon oxide; silicon; or carbon-based (organic) low-k dielectric materials.

Patterning of Second Insulator Layer 36

Figure 9:
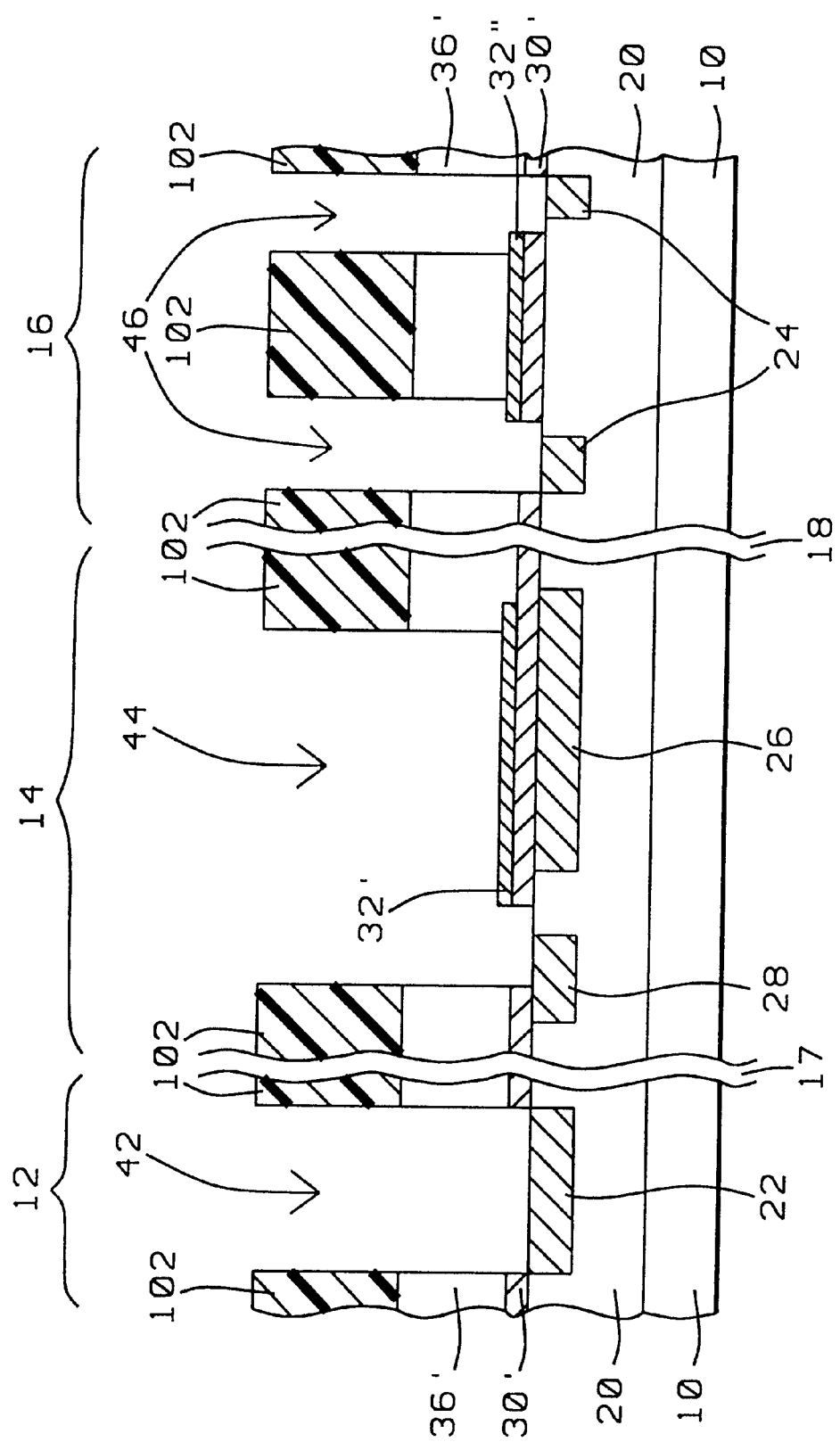

As shown in FIG. 9, a resist lithography second resist masking layer ("inductor mask") 102, for example, is formed over second insulator layer 36 and second insulator layer 36 is patterned to align and define single damascene trenches 42, 44, 46 for:

(1) inductor 12 trench shape 42 (spiral inductor features) optionally aligned coincidentally to an underlying inductor last interconnect metal layer 22 in which case the total inductor resistance can be reduced from the stacking of the two metal layers;

(2) trench shape 44 to function as MIM capacitor 14 top electrode connection 28 aligned nominally smaller that the top electrode second metal layer 32' (to prevent electrical shorting) except where the top electrode 46 will extend beyond the edge of the bottom electrode 26;

(3) trench shapes 46 to end-contacts/routing 24 of the precision resistor 16; and (4) to the bonding pads (not shown) used for electrical testing and assembly.

Using the second resist masking layer 102 and conventional plasma etch techniques, thick second insulator layer 36 is etched down to the top electrode metal 28 of MIM capacitor 14 and to the metal end-contacts 24 of precision resistor 16. Simultaneously, the thick second insulator layer 36 is etched down to the copper surface of the bottom half 22 of stacked spiral inductor 12, and the thick second insulator layer 36 and the underlying capacitor dielectric layer 30 is etched down in the bond pad region(s) (not shown).

The plasma etch equipment may employ endpoint or time calculated etching and judicious etch chemistry and etch conditions known to those skilled in the art of plasma etch to assure the desired metallization is cleared of the thick second insulator layer 36 while minimizing excessive loss of the underlying layers 32', 32'', 30, 20, 22, 24, 26, 28.

Filling of Second Insulator Layer Trenches With Copper

Figure 10:
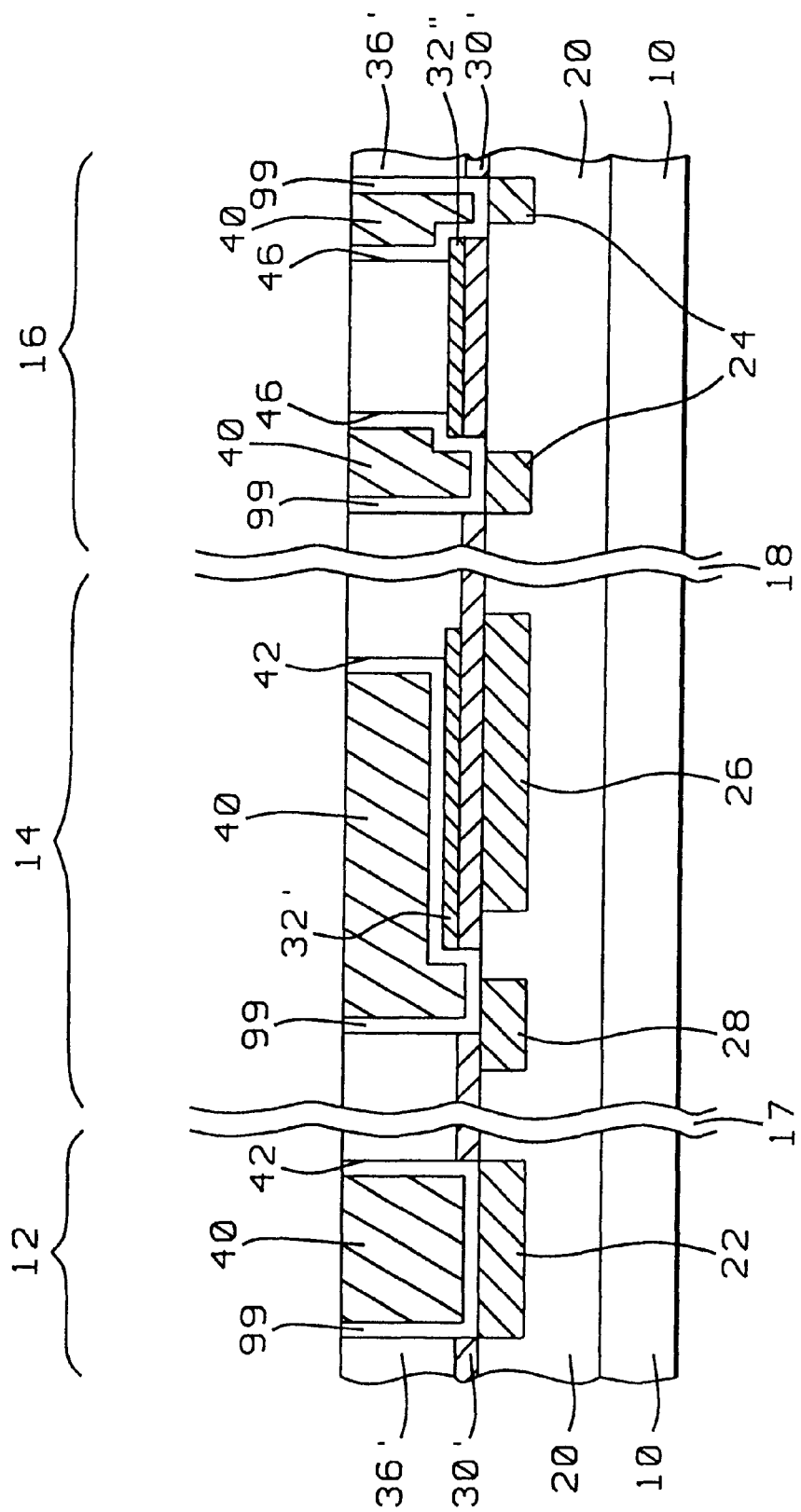

As shown in FIG. 10 trench shapes 42, 44, 46 are completely filled with metal, preferably copper in conjunction with a barrier metal, preferably using PVD, CVD and/or electroplating techniques.

A copper diffusion barrier metal layer 99 is first formed within trench shapes 42, 44, 46, coating the sidewalls and bottoms of trench shapes 42, 44, 46 within patterned thick second dielectric layer 36' before deposition of the metal to fill trench shapes 42, 44, 46. The copper barrier metal layer 99 is preferably comprised of Ta, TaN, TiN or TiW.

It is noted that if aluminum or an aluminum alloy were used to fill trench shapes 42, 44, 46, then a barrier metal layer 99 would not be required.

Following a conventional damascene process, a CMP removes the excess of the copper and any barrier metal layer from outside the trench shapes 42, 44, 46 so that only the trench shapes 42, 44, 46 are left filled with copper shapes 40, 46, 48, respectively, while the surrounding field is cleared of copper and barrier metal.

Standard wafer processes used for passivation and protection of the processed wafer 10 containing the above described RF IC inductor 12, MIM resistor 14 and precision resistor 16 structures are then completed in preparation for standard IC wafer testing and assembly.

Experimental Results

Figure 17:
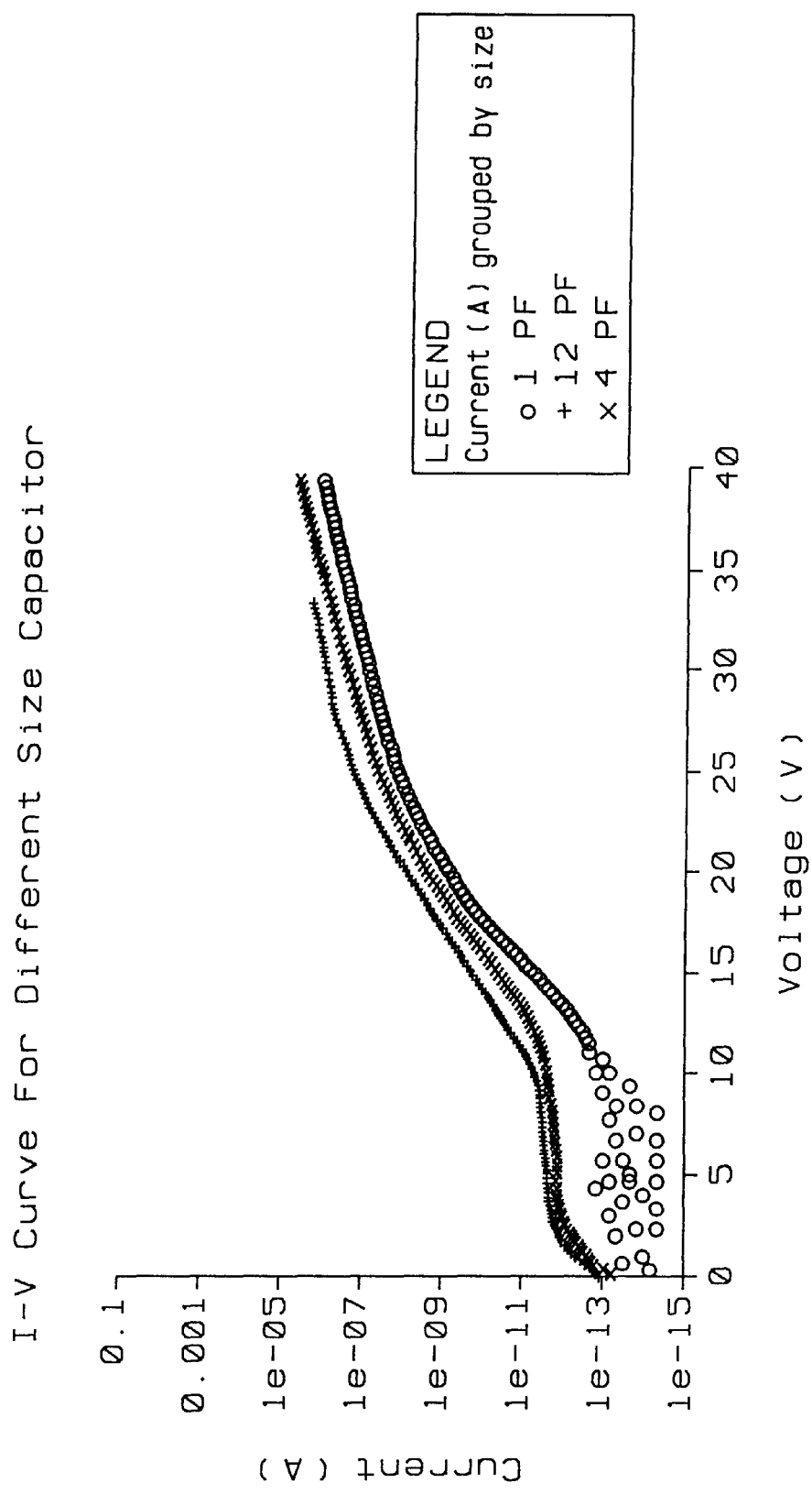
FIG. 17 is a graph illustrating different size capacitor leakage performance for a MIM capacitor fabricated in accordance with the first embodiment of the present invention.
Figure 18:
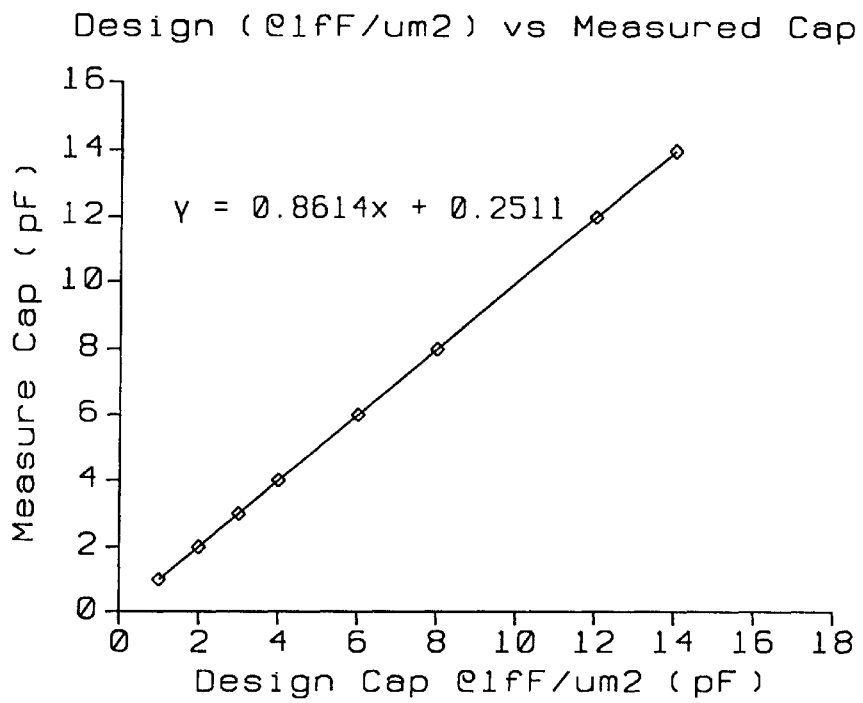
FIG. 18 is a graph illustrating capacitance measurements from an RF IC short-loop lot MIM capacitor fabricated in accordance with the first embodiment of the present invention.

I. An MIM capacitor 14 was fabricated having a first dielectric insulator SiN layer 30 having a thickness of about 700 Å, a 1000 Å thick Ta top electrode 32' and with a Cu strapping damascene connection 46. FIG. 17 is a graph illustrating different size capacitor leakage performance for the fabricated MIM capacitor 14. It is noted that the initial leakage differences were due to the change of the probing pin. FIG. 18 is a graph illustrating capacitance measurements from the RF IC short-loop lot fabricated MIM capacitor 14 (measure cap (pF) v. design cap@1 fF/$\mu m^2$ (pF))

As shown in FIGS. 17 and 18, both the leakage and capacitance values have reasonable values (capacitance of 1 fF/$\mu m^2$ was expected to require nitride of about 620 Å).

Figure 19:
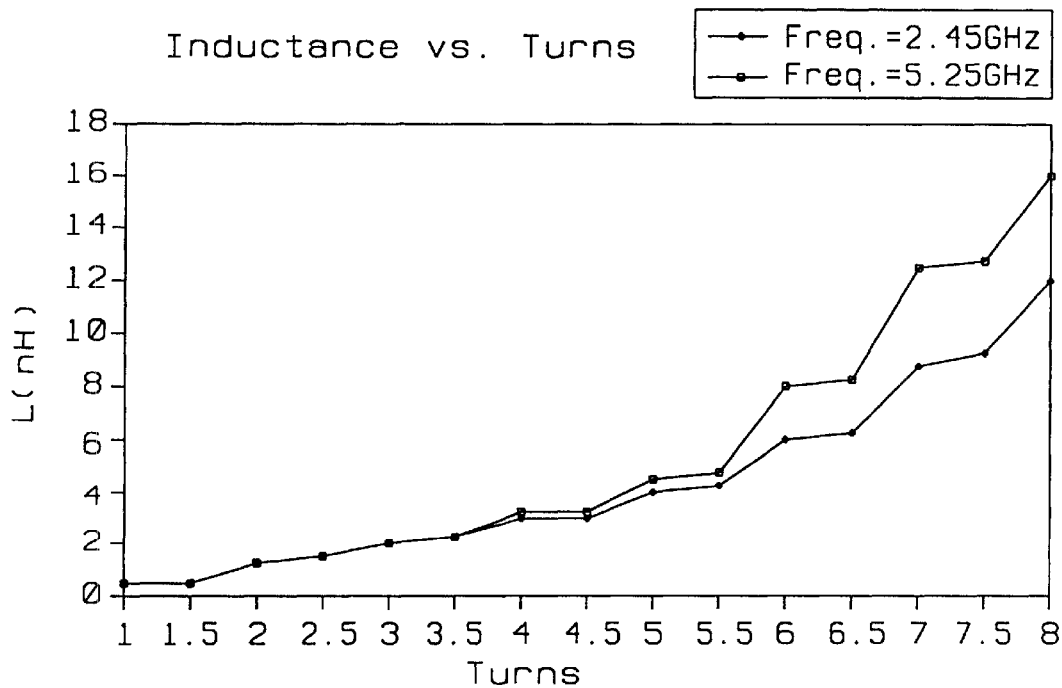
FIG. 19 is a graph charting inductance v. turns for a copper inductor fabricated in accordance with the first embodiment of the present invention.
Figure 20:
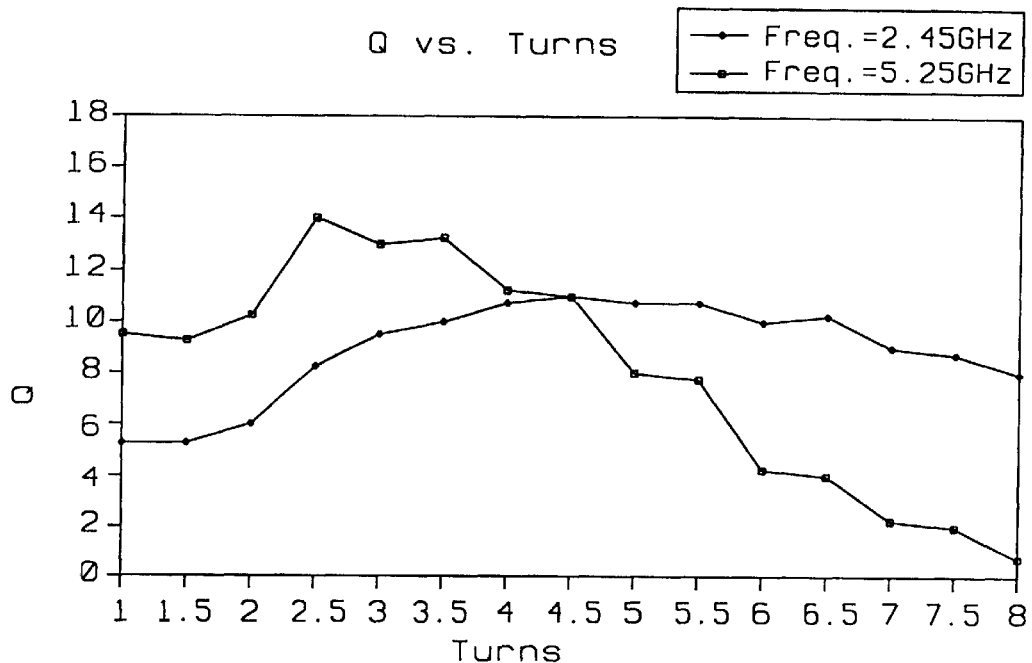
FIG. 20 is a graph charting Q v. turns for a copper inductor fabricated in accordance with the first embodiment of the present invention.

II. An inductor 12 was fabricated with the stack of two copper layers 22, 40 having respective thicknesses of about 0.35 $\mu$m (bottom) and 1.8 $\mu$m (top). FIG. 19 is a graph charting inductance v. turns for the copper inductor 12; FIG. 20 is a graph charting Q v. turns for the copper inductor 12; and FIG. 21 is a graph charting Q peak and f@Q peak v. turns for the copper inductor 12.

Figure 21:
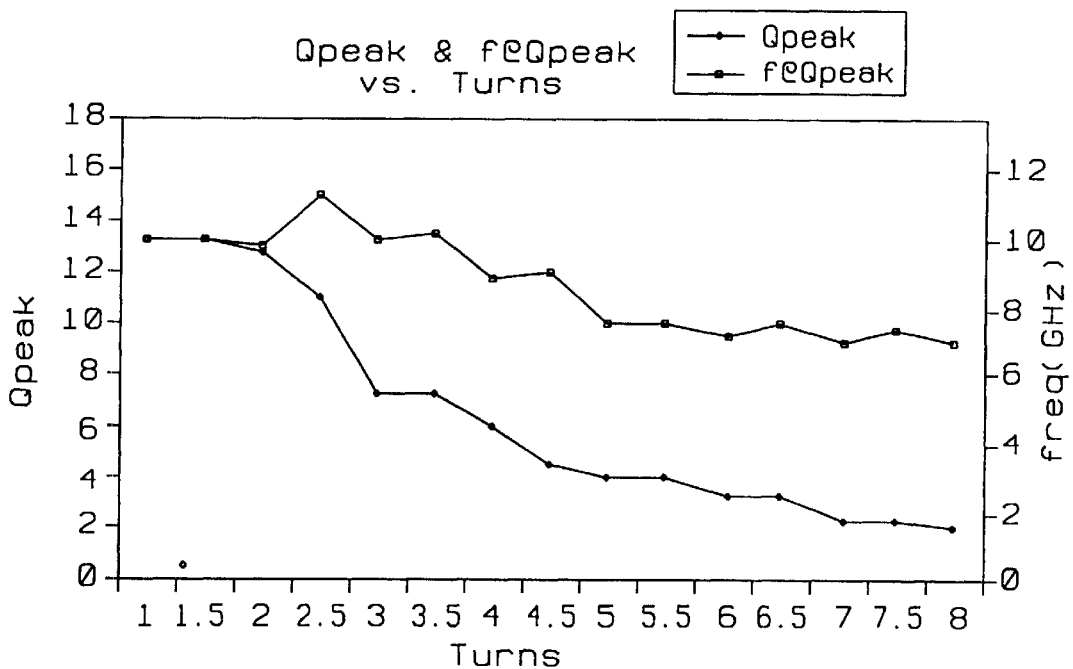
FIG. 21 is a graph charting Q peak and f @ Q peak v. turns for a copper inductor fabricated in accordance with the first embodiment of the present invention.

As shown in FIGS. 19 through 21, the resulting inductance and Quality factor (Q) data for the inductor 12 so fabricated are consistent with expectations.

III. The following are the results of tests conducted on resistor structures 16 along side both inductor 12 and MIM capacitors 14 fabricated in accordance with the present invention:

|  | Ta/250Å | Ta/480Å | TaN/500Å |
| --- | --- | --- | --- |
| Sheet resistance (Ω/sq) | 133 | 54 | 50 |
| TCR (ppm/° C.) | −130 | −140 | −40 |

The relatively thick, single-damascene insulator 36 results in thick copper 40, 46, 48 to assure low resistance and good Q-value behavior of the inductor 12. The inductor 12 single-damascene mask 36' overlays and connects lower-lying metal 22, 24, 28 of the last interconnect level with the capacitor's 14 top electrode metal 28 and/or the ends 24 of the precision resistor 16 saving the need for an additional mask.

Second Embodiment

FIGS. 11 to 16, in conjunction with FIGS. 1 and 2, illustrate the second embodiment of the present invention. Unless otherwise indicated, the methods and materials as described above in the first embodiment may be used for the second embodiment modified as necessary after taking into consideration the modifications in the second embodiment. Essentially, only the differences between the first and second embodiments will be addressed.

The elements and structures for both the first and second embodiments have the same numbering except as noted and shown.

Formation of Copper Barrier First Metal Layer 50

Figure 11:
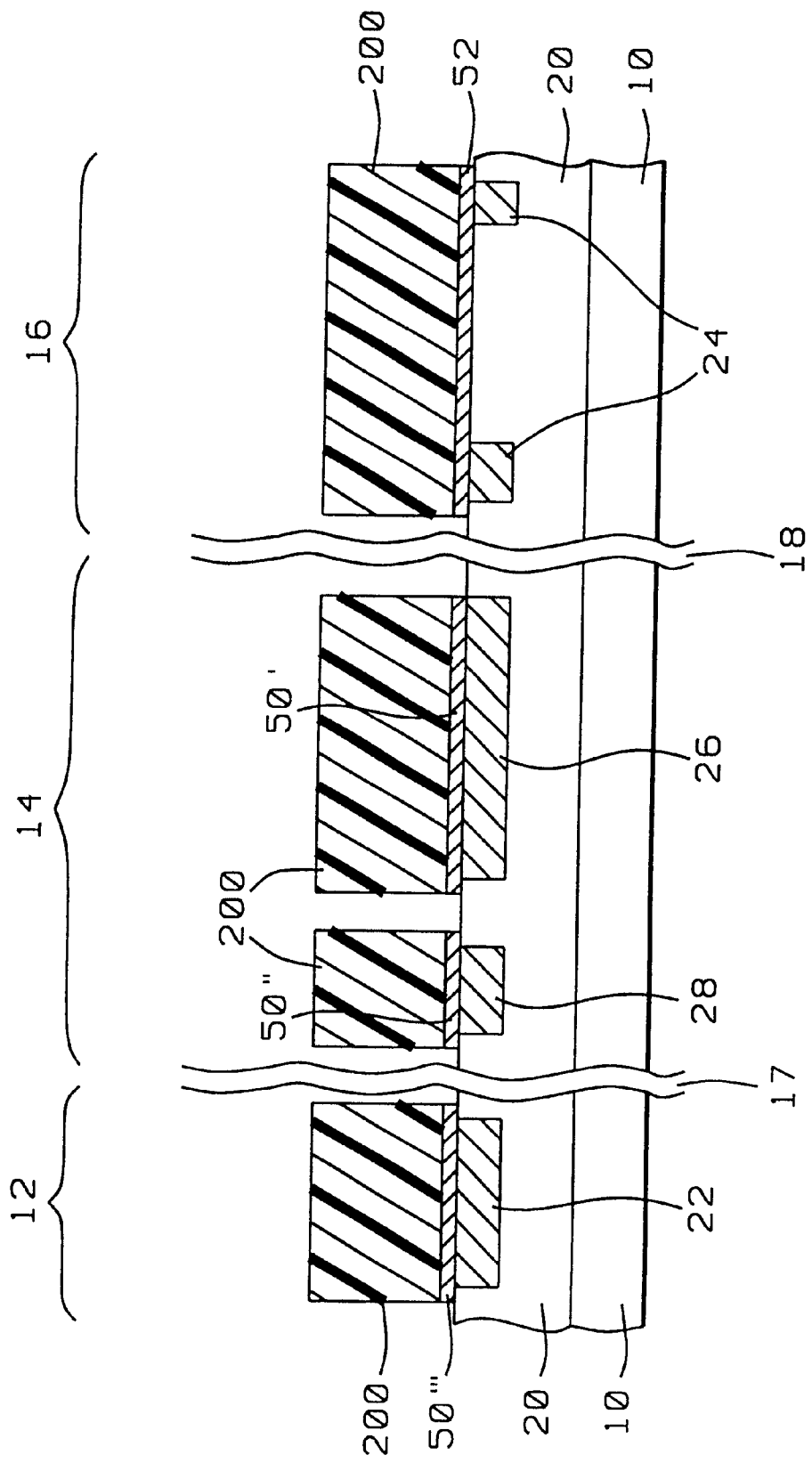

As shown in FIG. 11, a copper barrier first metal layer having desired precision resistor 16 characteristics is deposited directly upon the top-most interconnect copper pattern 22, 24, 26, 28 of the structure of FIG. 1. The copper barrier first metal layer is then resist patterned and etched with a first mask pattern (200), for example photoresist, that nominally oversizes the last copper interconnect pattern 26, 28, 22 (to prevent copper diffusion without shorting of neighboring lines) to form respective copper barrier first metal layer portions 50', 50'', 50''' while also creating the oversized copper barrier first metal layer portion 52 over the remaining copper interconnect pattern 24 of precision resistor 16. It is noted that the bottom MIM electrode can also be 50' comprised of a metal besides copper with copper diffusion properties.

The metal barrier layer is preferably comprised of TaN, Ta, TiN, TiW, NiCr, MoN, WN or WSiN and is more preferably comprised of Ta or TaN; and is preferably deposited by PVD, CVD or atomic layer chemical vapor deposition (ALCVD—a special kind of CVD for excellent thickness control of thin films that is commercially available from the firms ASM or Genus) methods. Metal barrier layer 50 is deposited to a thickness of from about 200 to 1500 Å and more preferably from about 200 to 700 Å, depending upon the desired resistance and barrier properties.

One skilled in the art will understand that the resistor 16 pattern may consist of a variety of shapes, most commonly in a meander pattern, in order to increase the resistor's 16 length and total resistance while occupying the least amount of area. Provision may also be made for later laser trimming of the structure in order to meet stringent resistance design criteria within the limitations of unavoidable process variations.

Optional Etching of Copper Barrier First Metal Layer Portions 50', 50'', 50'''

As shown in FIG. 12, copper barrier first metal layer portions 50', 50'', 50''' may be etched away leaving only copper barrier first metal layer portion 52 over copper interconnect pattern 24 of precision resistor 16. One skilled in the art will realize this option will relax the demands on the lithography needed to protect fine-line copper patterns. However the subsequent dielectric film 31 must then be suitable as a copper diffusion barrier such as, for example SiN.

Formation of Capacitor First Dielectric Layer 31

As shown in FIG. 13, capacitor first dielectric layer 31 is then deposited over the structure of FIG. 11 preferably to a thickness of from about 200 to 1500 Å and more preferably from about 300 to 700 Å.

As opposed to the first embodiment, in this second embodiment, the capacitor first dielectric layer 31 need not have copper diffusion barrier properties since the first metal layer portions 50', 50'', 50''', 52 serve as copper diffusion barriers. Capacitor first dielectric layer 31 is preferably comprised of SiO (oxide), nitride, SiN, SiON, $Ta_2O_5$, $HfO_2$, $ZrO_2$, MgO, $TiO_2$, $Y_2O_3$, $Al_2O_3$, $Ba_xSr_yTiO_z$, ferroelectric materials and multilayer oxides such as $Ta_xHf_yO_z$ and $Al_x$-$Ti_yO_z$ and is more preferably comprised of nitride or SiN.

Formation of MIM Capacitor Top Electrode Second Metal Layer 60

Figure 14:
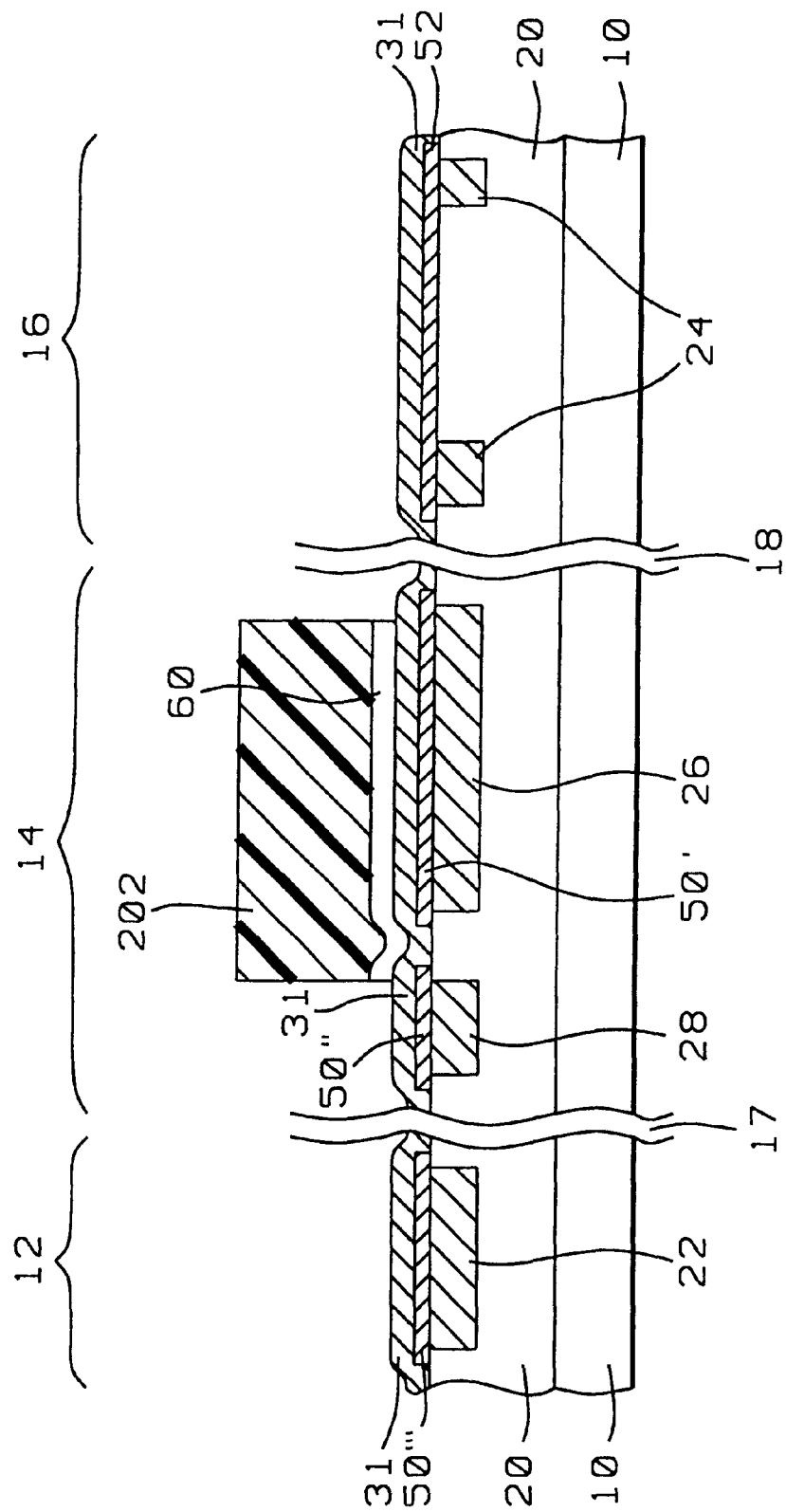

As shown in FIG. 14, a top electrode second metal layer 60 is then deposited and patterned with resist 202, for example, in the MIM capacitor area 14. Preferably wet chemical or plasma etching techniques are used to remove the top electrode metal in all but the intended MIM capacitor regions 14.

MIM capacitor top electrode metal layer 60 is preferably from about 500 to 1500 Å thick and is more preferably from about 700 to 1200 Å thick; and is preferably comprised of Ta, TaN, TiN, AlCu, WSiN, TiN/AlCu, Al alloys or Al alloys with barrier cladding layers such as Ti, TiN or TiW and is more preferably comprised of Ta or TaN.

Formation of Second Dielectric Layer 62

Figure 15:
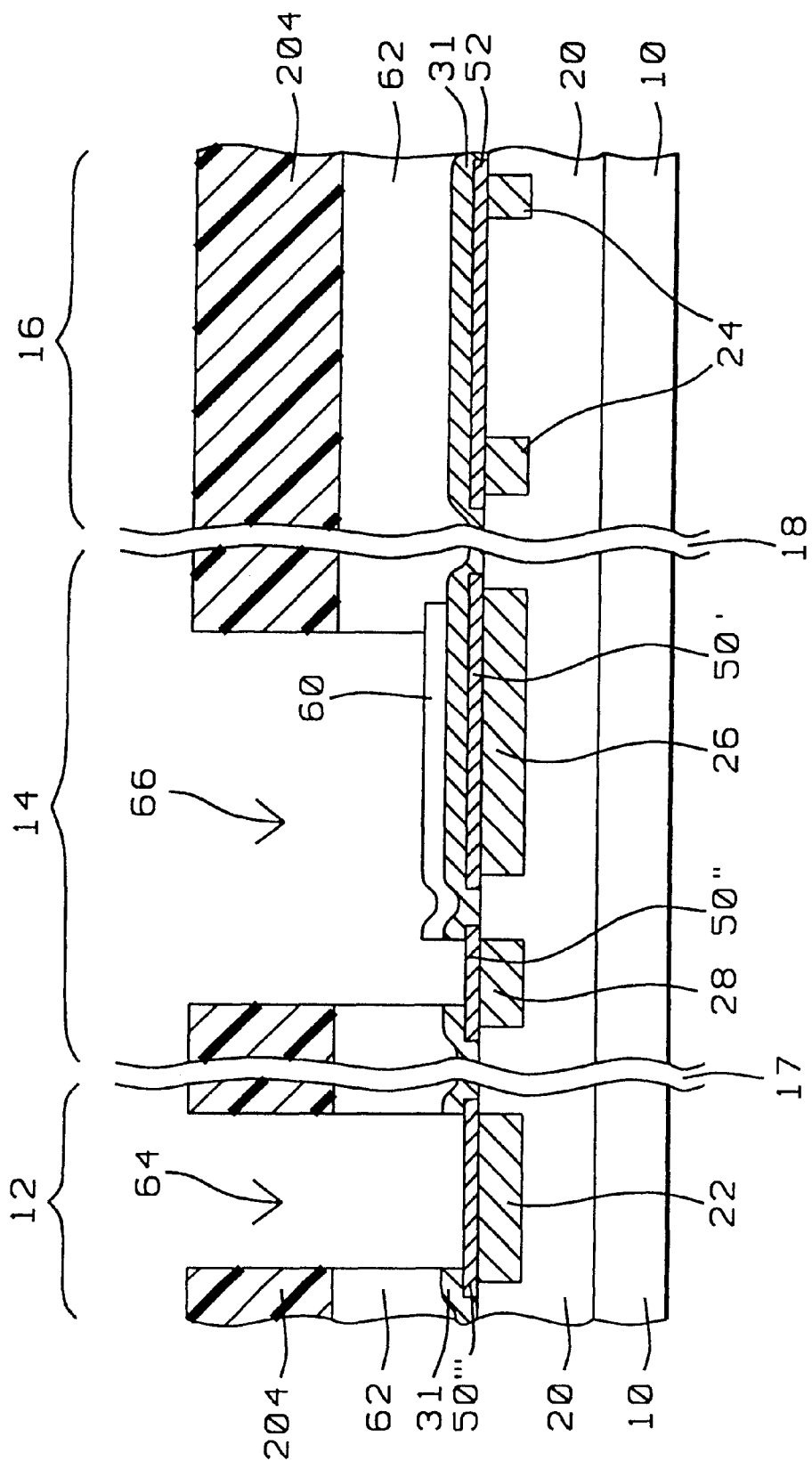

As shown in FIG. 15, a relatively thick second dielectric material is deposited as layer 62, patterned (by resist for example) and etched in the manner of a single damascene to create: an inductor trench 64 optionally aligned coincidentally to the inductor 12 underlying copper interconnect layer 22 as shown; and a connecting strap trench 66 exposing the MIM capacitor's 14 top electrode metal 60 and the MIM capacitor 14 last interconnect layer 28.

Second dielectric layer 62 is preferably from about 0.5 to 5.0 microns thick, is more preferably from about 2.0 to 3.0 microns thick and is preferably comprised of $SiO_2$, spin-on low-k dielectric, CVD low-k dielectric or combinations thereof.

Filling Inductor Trench 64 and Connecting Strap Trench 66

Figure 16:
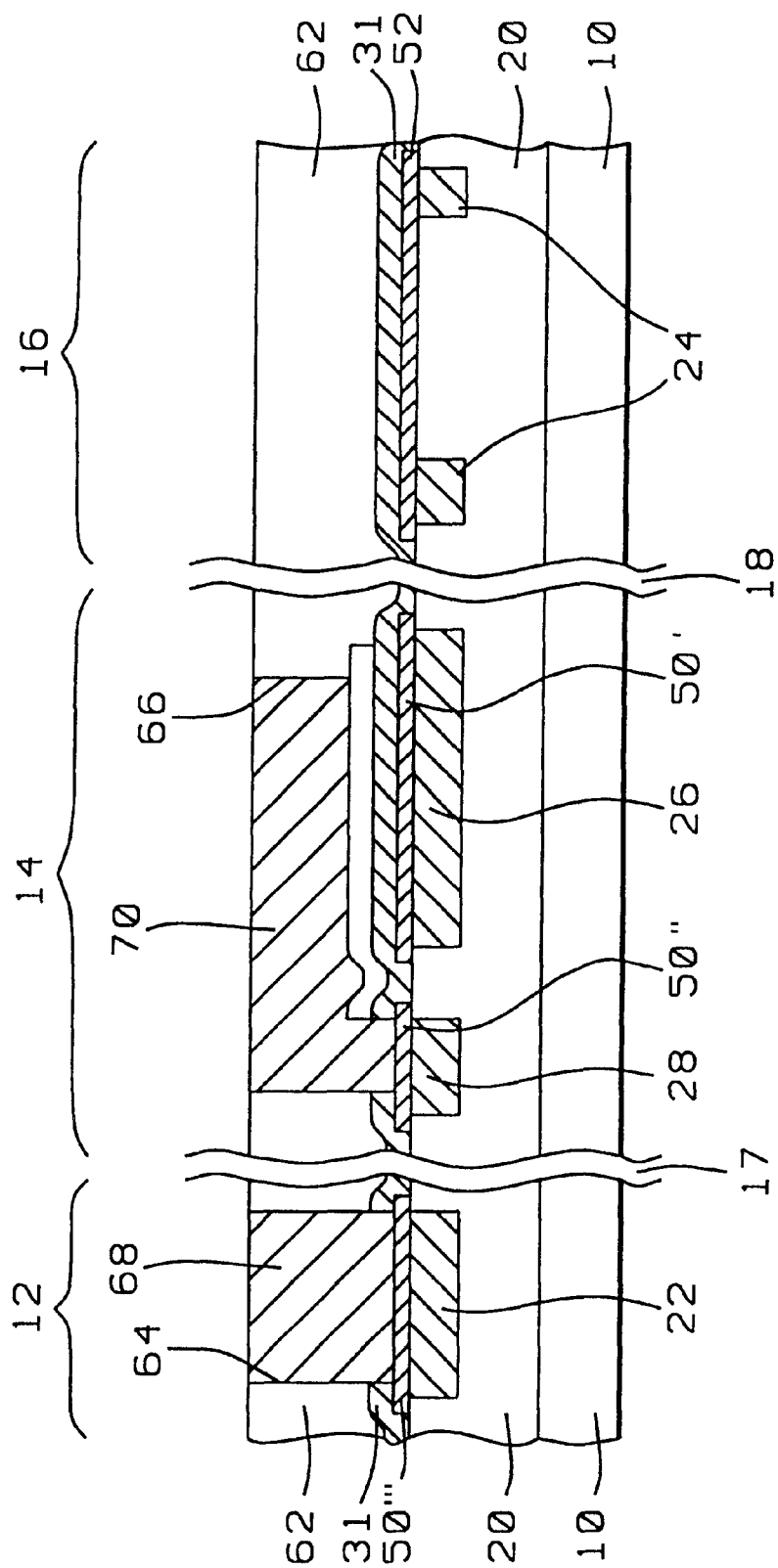

As shown in FIG. 16, copper is deposited over the structure of FIG. 15, filling inductor trench 64 and connecting strap trench 66 and is then etched back/planarized, preferably by chemical mechanical polishing (CMP) in the manner of single damascene creating inductor trench plug 68 and MIM capacitor 14 connecting strap trench plug 70.

A metal barrier layer (not shown) is also preferably formed on the bottom and walls of the inductor trench 64 and connecting strap trench 66 to a thickness of preferably from about 150 to 1000 Å and more preferably from about 200 to 500 Å before deposition of the copper within those trenches 64, 66 to form inductor trench plug 68 and MIM capacitor 14 connecting strap trench plug 70. The metal barrier layer is preferably comprised of Ta, TaN, TiW or TiN and is more preferably Ta or TaN.

Standard wafer processing used for passivation and protection of the processed wafer 10 containing the above described RF IC inductor 12, MIM resistor 14 and precision resistor 16 structures are then completed in preparation for standard IC wafer testing and assembly.

ADVANTAGES OF THE PRESENT INVENTION

The advantages of the present invention include:
1) in the first embodiment, only two additional masks are needed to add the inductor, MIM and resistor to a conventional copper backend;
2) the resistor, inductor and capacitor are added after the conventional complimentary metal oxide semiconductor (CMOS) interconnects without needing to change the underlying design rules or compromise the interconnect or device performance;
3) the position above the top-most interconnect routing level minimizes the coupling capacitance with the wafer substrate;
4) the inductor 12 single-damascene mask 36' overlays and connects lower-lying metal 22, 24, 28 of the last interconnect level with the capacitor's 14 top electrode metal 28 and/or the ends 24 of the precision resistor 16 saving the need for an additional mask;
5) a minimum of just one thin film deposition (for resistor and for capacitor top electrode) is required resulting in a cost savings and a small topographic step (desirable for subsequent lithographic patterning without additional CMP planarization);
6) in the second embodiment, only one thin film deposition (Ta, TaN or TiN) is required to make the metal resistor and the capacitor bottom electrode; and
7) in the second embodiment, only three (3) additional masks are needed to add resistor, capacitor and inductor to a conventional copper interconnect.

While particular embodiments of the present invention have been illustrated and described, it is not intended to limit the invention, except as defined by the following claims.

We claim:

1. A method of integrated circuit component integration in copper interconnects, including the steps of:
   providing a wafer having an exposed top-most planar copper interconnect; the wafer being divided into one or more areas selected from the group consisting of:
      a spiral inductor area having an exposed planar copper interconnect bottom half of a stacked spiral inductor;
      a MIM capacitor area having an exposed planar copper interconnect bottom plate and an exposed planar copper interconnect contact point of a MIM capacitor; and
      a precision resistor area having a two exposed planar copper interconnect routing points of a precision resistor;
   forming a first insulator layer over the structure;
   forming a metal layer over the first insulator layer;
   forming a first patterned masking layer over the metal layer covering at least a portion of the MIM capacitor area exposed planar copper interconnect bottom plate and at least a portion of the area between the precision resistor area planar copper interconnect routing points;
   etching the metal layer over the first dielectric insulator layer, without substantially etching the underlying first dielectric insulator layer, using the patterned first masking layer as a mask, to form a metal top plate over at least a portion of the interconnect bottom plate of a MIM capacitor and a patterned metal layer portion between the two planar copper interconnect routing points of a precision resistor;
   forming a second insulator layer over the structure;
   forming a second patterned masking layer over the second insulator layer exposing portions of the second insulator layer over:
      the planar copper interconnect bottom half of a stacked spiral inductor;
      at least a portion of the metal top plate and at least a portion of the planar copper interconnect contact point of a MIM capacitor; and
      the two exposed planar copper interconnect routing points of a precision resistor;
   etching the second insulator layer using the second patterned masking layer as a mask to form:
      an inductor trench exposing the planar copper interconnect bottom half of a stacked spiral inductor;
      a MIM capacitor trench exposing at least a portion of the metal top plate and at least a portion of the planar copper interconnect contact point of a MIM capacitor; and
      routing point trenches exposing the two exposed planar copper interconnect routing points of a precision resistor; and
   filling the inductor trench, the MIM capacitor trench and the routing point trenches with planarized metal to complete formation of the following devices as selected:
      the spiral inductor within the spiral inductor area;
      the MIM capacitor within the MIM capacitor area; and
      the precision resistor within the precision resistor area.

2. The method of claim 1, wherein the first dielectric insulator layer is comprised of a material selected from the group consisting of SiN, $Ta_2O_5$, SiON, $HfO_2$, $ZrO_2$, $Al_2O_3$, $Y_2O_3$, MgO, $TiO_2$, combinations thereof, high dielectric materials and ferroelectric materials.

3. The method of claim 1, wherein the first dielectric insulator layer is comprised of SiN.

4. The method of claim 1, wherein the first dielectric insulator layer serves as both a metal diffusion barrier and the MIM capacitor 14 dielectric.

5. The method of claim 1, wherein the first dielectric insulator layer has a thickness of from about 200 to 1000 Å; the metal layer over the first dielectric insulator layer has a thickness of from about 200 to 700 Å.

6. The method of claim 1, wherein the first dielectric insulator layer has a thickness of from about 600 to 700 Å and is comprised of SiN; the metal layer over the first dielectric insulator layer has a thickness of from about 200 to 700 Å.

7. The method of claim 1, wherein the metal layer over the first dielectric insulator layer is comprised of a material selected from the group consisting of TaN, Ta, TiN, TiW, NiCr, MoN, WN or WSiN.

8. The method of claim 1, wherein the metal layer over the first dielectric insulator layer is comprised of a material selected from the group consisting of TaN and Ta.

9. The method of claim 1, wherein the metal layer over the first dielectric insulator layer is formed by a method selected from the group consisting of evaporation, CVD and PVD.

10. The method of claim 1, wherein the wafer includes a MIM capacitor area and does not include a precision resistor area; and the metal layer over the first dielectric insulator layer is comprised of a material selected from the group consisting of Al and an Al alloy having a thickness of from about 500 to 1500 Å.

11. The method of claim 1, including the step of forming a dielectric capping layer over the metal layer over the first dielectric insulator layer.

12. The method of claim 1, including the step of forming a dielectric capping layer over the metal layer over the first dielectric insulator layer; the dielectric capping layer having a thickness of from about 200 to 1000 and being comprised of a material selected from the group consisting of SiN, $SiO_2$ or SiON.

13. The method of claim 1, wherein the patterned first masking layer formed over the metal layer also covers at least a portion of the area between the precision resistor area planar copper interconnect routing points.

14. The method of claim 1, wherein the etching of metal layer over the first dielectric insulator layer uses a process selected from the group consisting of a wet chemical etch process and a plasma etch process.

15. The method of claim 1, wherein an additional dielectric layer is formed over the metal layer over the first dielectric insulator layer, and the diffusion barrier layer and the metal layer over the first dielectric insulator layer are both etched using the patterned first masking layer.

16. The method of claim 1, wherein the second insulator layer is from about 0.5 to 5.0 microns thick.

17. The method of claim 1, wherein the second insulator layer is comprised of a material selected from the group consisting of silicon oxide, silicon dielectric material and organic low-k organic material; and the second insulator layer is formed by a process selected from the group consisting of PECVD and a spin-on technique.

18. The method of claim 1, wherein the inductor trench, the MIM capacitor trench and the routing point trenches are filled with planarized copper.

19. The method of claim 1, wherein a diffusion barrier metal layer lining is formed within the inductor trench, the MIM capacitor trench and the routing point trenches before filling the inductor trench, the MIM capacitor trench and the routing point trenches with planarized metal.

20. A method of integrated circuit component integration in copper interconnects, including the steps of:
   providing a wafer having an exposed top-most planar copper interconnect; the wafer being divided into one or more areas selected from the group consisting of:
      a spiral inductor area having an exposed planar copper interconnect bottom half of a stacked spiral inductor;
      a MIM capacitor area having an exposed planar copper interconnect bottom plate and an exposed planar copper interconnect contact point of a MIM capacitor 14; and
      a precision resistor area having a two exposed planar copper interconnect routing points of a precision resistor;
   forming a copper barrier first metal layer over the structure;
   forming a first patterned masking layer over the copper barrier first metal layer that covers at least:
      the copper barrier first metal layer over planar copper interconnect bottom half of a stacked spiral inductor;
      the copper barrier first metal layer over the interconnect bottom plate and the planar copper interconnect contact point of a MIM capacitor; and
      the copper barrier first metal layer over the two planar copper interconnect routing points of a precision resistor and the area between the two planar copper interconnect routing points;
   etching the copper barrier first metal layer using the first patterned masking layer as a mask to form patterned copper barrier first metal layer portions over the respective:
      planar copper interconnect bottom half of a stacked spiral inductor;
      the interconnect bottom plate and the planar copper interconnect contact point of a MIM capacitor; and
      the two planar copper interconnect routing points of a precision resistor and the area between the two planar copper interconnect routing points;
   forming a capacitor first dielectric layer over the structure;
   forming a top electrode second metal layer over the capacitor first dielectric layer;
   forming a second patterned masking layer over the top electrode second metal layer that covers the top electrode second metal layer over at least a portion of the interconnect bottom plate;
   etching the top electrode second metal layer using the second patterned masking layer as a mask to form a MIM capacitor top electrode metal plate;
   removing the second patterned masking layer;
   forming a second dielectric layer over the structure;
   forming a third patterned masking layer over the second dielectric layer exposing the second dielectric layer over:
      the planar copper interconnect bottom half of a stacked spiral inductor; and
      at least a portion of the MIM capacitor top electrode metal plate and at least a portion of the planar copper interconnect contact point of a MIM capacitor, and all of the area between the MIM capacitor top electrode metal plate and the planar copper interconnect contact point of a MIM capacitor;
   etching the second dielectric layer using the third patterned masking layer as a mask to form:
      an inductor trench exposing the planar copper interconnect bottom half of a stacked spiral inductor; and
      a connecting strap trench exposing at least a portion of the MIM capacitor top electrode metal plate and at least a portion of the planar copper interconnect contact point of a MIM capacitor;
   filling the inductor trench and the connecting strap trench 66 with planarized metal to complete formation of the following devices as selected:
      the spiral inductor within the spiral inductor area;
      the MIM capacitor within the MIM capacitor area; and
      the precision resistor within the precision resistor area.

21. The method of claim 20, wherein the copper barrier first metal layer is a material selected from the group consisting of TaN, Ta, TiN, TiW, NiCr, MoN, WN or WSIN.

22. The method of claim 20, wherein the copper barrier first metal layer is a material selected from the group consisting of TaN and Ta.

23. The method of claim 20, wherein the copper barrier first metal layer has a thickness of from about 200 to 1500 Å and is formed by a process selected from the group consisting of a PVD process, an ALCVD process and a CVD process.

24. The method of claim 20, wherein the copper barrier first metal layer has a thickness of from about 200 to 700 Å and is formed by a process selected from the group consisting of a PVD process, an ALCVD process and a CVD process.

25. The method of claim 20, wherein the patterned first patterned masking layer covers only at least the copper barrier first metal layer over the two planar copper interconnect routing points of a precision resistor and the area between the two planar copper interconnect routing points; and the copper barrier first metal layer is etched to form a patterned copper barrier first metal layer portion only over the two planar copper interconnect routing points of a precision resistor and the area between the two planar copper interconnect routing points.

26. The method of claim 20, wherein the capacitor first dielectric layer has a thickness of from about 200 to 1500 Å and is comprised of a material selected from the group consisting of oxide, SiO (oxide), SiN, SiON, $Ta_2O_5$, $HfO_2$, $ZrO_2$, MgO, $TiO_2$, $Y_2O_3$, $Al_2O_3$, $Ba_xSr_yTiO_z$, ferroelectric materials and multilayer oxides such as $Ta_xHf_yO_z$ and $Al_xTi_yO_z$.

27. The method of claim 20, wherein the capacitor first dielectric layer has a thickness of from about 300 to 700 Å and is comprised of nitride.

28. The method of claim 20, wherein the top electrode second metal layer has a thickness of from about 500 to 1500 Å and is comprised of a material selected from the group consisting of Ta, TaN, TiN, AlCu, WSiN, TiN/AlCu, Al alloys and Al alloys with barrier cladding layers such as Ti, TiN or TiW.

29. The method of claim 20, wherein the second dielectric layer has a thickness of from about 0.5 to 5.0 microns and is comprised of a material selected from the group consisting of $SiO_2$, spin-on low-k dielectric, CVD low-k dielectric and combinations thereof.

30. The method of claim 20, wherein a metal barrier layer lining is formed within the inductor trench and the connecting strap trench before filling the inductor trench and the connecting strap trench 66 with planarized metal.

31. The method of claim 20, wherein the planarized metal filling the inductor trench and the connecting strap trench is copper.

* * * * *

UNITED STATES PATENT AND TRADEMARK OFFICE
CERTIFICATE OF CORRECTION

PATENT NO. : 6,534,374 B2
DATED : March 18, 2003
INVENTOR(S) : Eric Johnson et al.

It is certified that error appears in the above-identified patent and that said Letters Patent is hereby corrected as shown below:

<u>Title page,</u>
Item [75], please delete "Mark Hatzilambrou, Singapore (SG)" and replace it with
-- Mark Hatzilambrou, La Canada Flintridge, CA --.

Signed and Sealed this

Nineteenth Day of August, 2003

JAMES E. ROGAN
*Director of the United States Patent and Trademark Office*

UNITED STATES PATENT AND TRADEMARK OFFICE
CERTIFICATE OF CORRECTION

PATENT NO. : 6,534,374 B2
DATED : March 18, 2003
INVENTOR(S) : Eric Johnson et al.

It is certified that error appears in the above-identified patent and that said Letters Patent is hereby corrected as shown below:

Drawings,
Figure (7), delete "35'" and "35'" and replace with -- 34' and 34" -- (as shown on attached page).
Figure (8), delete "34'" and "34'" and replace with -- 35' and 35" -- (as shown on attached page).

Column 5,
Line 29, replace "singer" with -- single --.

Column 7,
Line 23, replace "34" with -- 35 --.

Column 11,
Line 53 replace "structure" with -- wafer --.

Column 12,
Line 1, replace "structure" with -- wafer --.

Column 13,
Line 45, delete "14".
Line 49, replace "stucture" with -- wafer --.

Column 14,
Lines 6 and 17 replace "structure" with -- wafer --.
Line 38, add -- and -- before "filling".
Line 38, replace "the" with -- an --.

Signed and Sealed this

Fourth Day of April, 2006

JON W. DUDAS
*Director of the United States Patent and Trademark Office*